US008188557B2

(12) United States Patent
Rombach et al.

(10) Patent No.: US 8,188,557 B2
(45) Date of Patent: May 29, 2012

(54) SINGLE DIE MEMS ACOUSTIC TRANSDUCER AND MANUFACTURING METHOD

(75) Inventors: Pirmin Rombach, Lyngby (DK); Morten Berg Arnoldus, Copenhagen (DK); Morten Ginnerup, Lyngby (DK)

(73) Assignee: Pulse MEMS Aps., Roskilde (DK)

( * ) Notice: Subject to any disclaimer, the term of this patent is extended or adjusted under 35 U.S.C. 154(b) by 840 days.

(21) Appl. No.: 12/295,220

(22) PCT Filed: Mar. 29, 2007

(86) PCT No.: PCT/DK2007/000157
§ 371 (c)(1), (2), (4) Date: Sep. 29, 2008

(87) PCT Pub. No.: WO2007/112443
PCT Pub. Date: Oct. 11, 2007

(65) Prior Publication Data

US 2009/0169035 A1 Jul. 2, 2009

(51) Int. Cl.
*H01L 29/84* (2006.01)

(52) U.S. Cl. ................. 257/416; 257/E29.324; 381/175

(58) Field of Classification Search .................. 381/175; 257/416, E29.324
See application file for complete search history.

(56) References Cited

U.S. PATENT DOCUMENTS 5,452,268 A * 9/1995 Bernstein ...................... 367/181
5,490,220 A * 2/1996 Loeppert ...................... 381/355
5,573,679 A 11/1996 Mitchell et al.
5,677,965 A * 10/1997 Moret et al. .................. 381/191
6,088,463 A * 7/2000 Rombach et al. ............. 381/174
6,178,249 B1 1/2001 Hietanen et al.
6,522,762 B1 2/2003 Mullenborn et al.
6,628,039 B2 9/2003 Dhuler
6,825,967 B1 11/2004 Chong et al.
(Continued)

FOREIGN PATENT DOCUMENTS

EP 0561566 A2 9/1993
(Continued)

*Primary Examiner* — Lex Malsawma
(74) *Attorney, Agent, or Firm* — K. David Crockett, Esq.; Niky Economy Syrengelas, Esq.; Crockett & Crockett, PC

(57) ABSTRACT

The invention relates to an acoustic micro-electrical-mechanical-system (MEMS) transducer formed on a single die based on a semiconductor material and having front and back surface parts opposed to each other. The invention further relates to a method of manufacturing such an acoustic MEMS transducer. The acoustic MEMS transducer comprises a cavity formed in the die to thereby provide a back volume with an upper portion facing an opening of the cavity and a lower portion facing a bottom of the cavity. A back plate and a diaphragm are arranged substantially parallel with an air gap there between and extending at least partly across the opening of the cavity, with the back plate and diaphragm being integrally formed with the front surface part of the die. The bottom of the cavity is bounded by the die. The diaphragm may be arranged above the back plate and at least partly extending across the back plate. It is preferred that the backside openings are formed in the die with the openings extending from the back surface part of the die to the cavity bottom. Part of or all of the backside openings may be acoustically sealed by a sealing material.

15 Claims, 26 Drawing Sheets

Sacrificial etch
- Vapor etch of sacrificial oxide
- SAM coating of membrane and back plate

U.S. PATENT DOCUMENTS

| | | | | |
|---|---|---|---|---|
| 6,829,131 | B1 | 12/2004 | Loeb et al. | |
| 6,847,090 | B2 * | 1/2005 | Loeppert | 257/418 |
| 7,152,481 | B2 * | 12/2006 | Wang | 73/718 |
| 2003/0133588 | A1 * | 7/2003 | Pedersen | 381/423 |
| 2005/0018864 | A1 | 1/2005 | Minervini | |
| 2007/0165888 | A1 * | 7/2007 | Weigold | 381/174 |

FOREIGN PATENT DOCUMENTS

| | | | |
|---|---|---|---|
| EP | 1529753 | A2 | 5/2005 |
| JP | 07-050899 | | 2/1995 |
| JP | 2002-239999 | | 8/2002 |
| JP | 2004-260187 | | 9/2004 |

* cited by examiner

Porous Si Process sequence

Bulk Si (1), CMOS compatible

Porous Si Process sequence

Formation of highly doped conductive layer (2)
- Deposition of B++ Epi as contact for porous Si formation
- Or implantation and diffusion of dopant Porous Si Process sequence Deposition of metal (Al) on backside (3) for electrical contact during porous Si formation using for example the lift-off technique Porous Si Process sequence Deposition and patterning of protection layer (4)

- Si-oxide structured using photoresist mask and HF etching

Porous Si Process sequence

Mounting of wafer in electrochemical cell for porous Si formation. The cell consists of a holder (5) separating the front from the backside so that an etching solution (6) can only attack the front side. Furthermore the electrode (3) is connected to an electrode (7) by a voltage source (8).

Porous Si Process sequence

Porous Si formation (9) in the unprotected area by using externally applied voltage (8) and HF solution (6). The process is called silicon anodisation and by varying the voltage and the HF concentration, the porosity level can be adjusted from 1 nm up to 1 $\mu$m.

Porous Si Process sequence

De-mounting of the electrochemical cell

Porous Si Process sequence

Etching of the electrode metal Al (3) in phosphoric acid solution and the protection layer (4) in HF MEMS structure formation Deposition and structuring of layers for MEMS condenser microphone
- Silicon oxide for electrical insulation of microphone electrodes (10)
- Conductive silicon based material for back plate (11) and diaphragm (12)

Back volume formation

Deposition of a masking layer, silicon oxide (13) and patterning of this layer using photoresist and HF etching.

Back volume formation

Back side etching to form channels (14) to the porous silicon region (9)

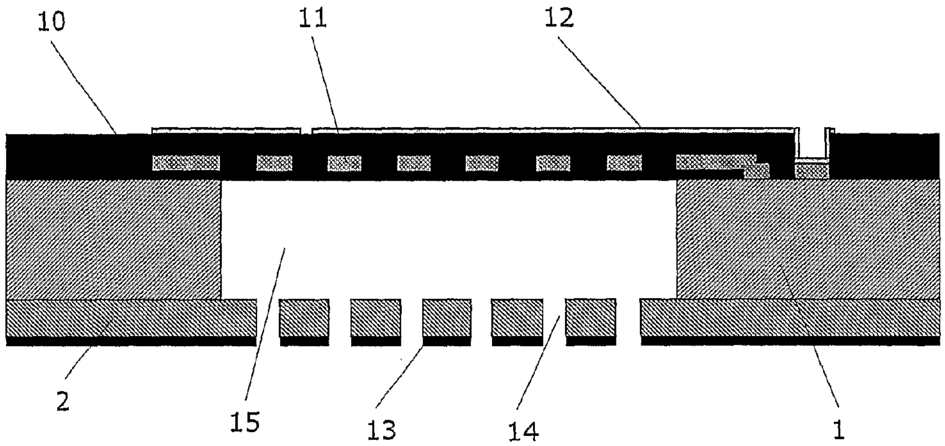

Back volume formation

Sacrificial etch of the porous Si region using a KOH based solution to form the back volume (15). The Front side has to be protected during this etch with a KOH resistant polymer layer or photoresist.

Fig. 1l

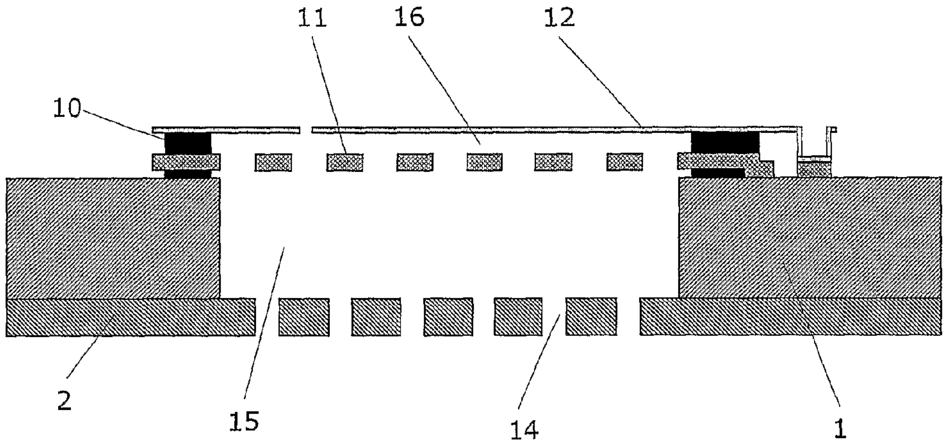

MEMS release process

The silicon oxide layers (10) defining the microphone air gap (16) and the protection layer (13) are being etched in vapor HF in order to release the MEMS microphone structure. The HF reaches the oxide between diaphragm (12) and backplate (11) through the etch channels (14) in the backside.

Fig. 1m

Back volume closing

Closing of the backvolume by deposition of a silicon oxide layer (17) into the etching channels, using an APCVD (Air Pressure Chemical Vapor Deposition) process. Instead of an silicon oxide also other materials like thick spin-on polymers can be used to close the etching channels.

Bulk Si, CMOS compatible

Deposition of B++ Epi as contact for porous Si formation

Vertical feedthrough integration

Deep etching, DRIE

Vertical feedthrough integration
- Deposition of insulation layer, SiO2
- Filling with conductive layer, highly doped poly-Si Vertical feedthrough integration
Back-etching/-polishing of poly-Si and SiO2

CMOS integration

- On top of the wafer with integrated vertical feedthroughs, any CMOS process can be added
- The circuit might have an analog and digital part
- The metallization layers of the CMOS process are being used to contact the feed-throughs Local formation of porous silicon defining the back volume

- Deposition of contact metal on backside

Local formation of porous silicon defining the back volume
- Formation of porous silicon using HF (hydrofluoric acid) in an electrochemical cell
- Protection of CMOS and backside Local formation of porous silicon defining the back volume
- Removing of contact metal on backside Processing of MEMS microphone structure on top of porous silicon area
- Deposition and structuring of 1st low temperature insulation layer, oxide Processing of MEMS microphone structure on top of porous silicon area
- Deposition and structuring of backplate low temperature conductive layer, e.g. SiGe Processing of MEMS microphone structure on top of porous silicon area
- Deposition and structuring of 2nd low temperature insulation layer, oxide Processing of MEMS microphone structure on top of porous silicon area
- Deposition and structuring of membrane low temperature conductive layer, e.g. SiGe or sandwich layer with silicon nitride Back side metal
- Contact hole opening in backside oxide Back side metal
- deposition and patterning of Al Back side metal
- SMD pad UBM deposition, Ni/Au (Ni/Pd/Au, Ni/Pd)

Back side structure for sacrificial etch
- Oxide etching/patterning

Back side structure for sacrificial etch
- RIE etch of bulk silicon

Sacrificial etch
- Wet etch of porous silicon/ KOH, TMAH
- Protection of the microphone side and the backside pads Sacrificial etch
- Vapor etch of sacrificial oxide
- SAM coating of membrane and back plate Closing of back volume
- Deposition of capping oxide/nitride on backside, APCVD processes Closing of back volume
- Opening of capping oxide/nitride on pads, RIE

SINGLE DIE MEMS ACOUSTIC TRANSDUCER AND MANUFACTURING METHOD

FIELD OF THE INVENTION

The present invention relates to an acoustic micro-electrical-mechanical-system (MEMS) transducer formed on a single die based on a semiconductor material.

BACKGROUND OF THE INVENTION

MEMS acoustic transducers for application in portable communication devices such as mobile terminals and hearing prostheses must be robust devices of small size and low cost and still maintain good electro-acoustic performance, reliability and operability. A significant issue in keeping the manufacturing costs low and reliability high for MEMS acoustic transducers is to reduce the number of separate components that need to be manufactured, tested and assembled. The assembly of multi-component MEMS acoustic transducers has several drawbacks due to the small dimensions of each of these components and the required precise alignment of each of these components. The delicate assembly process increases manufacturing time and leads to yield loss, which translates to increased manufacturing costs.

EP 0 561 566 B1 discloses a silicon microphone assembly, which comprises at least two separate components: a MEMS transducer die and a base member. The MEMS transducer die comprises an integrally formed diaphragm and back plate structure, a FET circuit and voltage bias source. A through going aperture extends from an upper portion of the MEMS transducer die, where the diaphragm and back plate structure is arranged, from beneath the back plate to a lower surface portion of the MEMS transducer die. The base member is secured to the lower surface of the MEMS transducer die by a wafer-level bonding process so as to seal the through going aperture at the lower surface portion of the MEMS transducer die and create a closed back chamber for the silicon microphone assembly. The prior art reference does not disclose how and where electrical terminals or bumps are located on the described silicon microphone assembly to provide connectivity to an external carrier such as a PCB.

US 2005/0018864 discloses a silicon microphone assembly which comprises three separate components: a MEMS transducer die, an integrated circuit die and a conventional PCB based substrate. The MEMS transducer die and the integrated circuit are attached to an upper surface of the PCB based substrate and interconnected with electrical traces. Plated feed-trough holes between the upper and lower opposing surface establish electrical connections to the lower surface of the PCB based substrate which also holds electrical terminals or bumps for electrically connecting the silicon microphone assembly to an external PCB. The lower surface is substantially plane and the electrical bumps are positioned to allow attachment of the silicon microphone assembly to the external PCB by conventional reflow soldering processes. Respective electrical contact pads of the MEMS transducer die and the integrated circuit substrate or die are wire-bonded to corresponding pads arranged on the upper surface of the PCB based substrate. An indentation or aperture in the PCB substrate arranged below the diaphragm and backplate structure of the MEMS transducer die serves as a back chamber or volume for the MEMS transducer die. An electrically conductive lid or cover is attached around the periphery of the upper portion of the PCB substrate to shield the MEMS transducer die and the integrated circuit from the external environment such as from light and moisture etc. A grid is placed in the sound inlet port formed in the electrically conductive lid and the inner volume, enclosed below the electrically conductive lid and the upper surface of the PCB substrate, makes up the front chamber of the silicon microphone assembly.

U.S. Pat. No. 6,522,762 discloses a silicon microphone assembly formed in a so-called "chip-scale package". The silicon microphone assembly comprises a MEMS transducer die, a separate integrated circuit die and a silicon carrier substrate with through holes formed therein. The MEMS transducer die and the integrated circuit are adjacently positioned and both attached to an upper surface of the silicon carrier substrate by flip chip bonding through respective sets of bond pads. The MEMS transducer die and the integrated circuit are interconnected with electrical traces running on the silicon carrier substrate. Feed-through structures between upper and lower opposing surfaces of the silicon carrier substrate establish electrical connections to the lower surface of the silicon substrate which also holds electrical terminals or bumps for electrically connecting the silicon microphone assembly to an external PCB. The lower surface is substantially plane and the electrical bumps are positioned to allow attachment of the silicon microphone assembly to the external PCB by conventional reflow soldering processes.

Akustica Inc. has announced, in Electronic Design Magazine on Jun. 9, 2003, an analog CMOS IC which comprises an array of 64 micromachined condenser microphones etched in silicon and integrated with an MOSFET amplifier.

U.S. Pat. No. 6,829,131 describes a MEMS die with an integral digital PWM amplifier connected to a silicon membrane structure adapted to generate a sound pressure signal by electrostatic actuation.

It is an object of the present invention to provide an improved MEMS acoustic transducer, which is formed on a single semiconductor die, whereby wafer-level bonding processes and/or the assembly of several components can be avoided in order to produce the MEMS acoustic transducer.

SUMMARY OF THE INVENTION

According to a first aspect of the present invention there is provided an acoustic microelectrical-mechanical-system (MEMS) transducer formed on a single die based on a semiconductor material and having front and back surface parts opposed to each other, said acoustic MEMS transducer comprising:

- a cavity formed in the die to thereby provide a back volume with an upper portion facing an opening of the cavity and a lower portion facing a bottom of the cavity; and
- a back plate and a diaphragm arranged substantially parallelly with an air gap there between and extending at least partly across the opening of the cavity, said back plate and diaphragm being integrally formed with the front surface part of the die;

wherein the bottom of the cavity is bounded by the die.

The present invention covers an embodiment, wherein the back plate is arranged above the diaphragm and at least partly extending across the back plate, but it also covers another preferred embodiment wherein the diaphragm is arranged above the back plate and at least partly extending across the back plate.

It is within an embodiment of the transducer of the invention that backside openings are formed in the die with said openings extending from the back surface part of the die to the cavity bottom. Here, at least part of or all of the backside openings may be acoustically sealed by a sealing material.

When the backside openings are acoustically sealed, the formed transducer may be an omni directional microphone, whereas when the backside openings are not acoustically sealed, the formed transducer may be a directional microphone. It is preferred that the back volume, and thereby the backside openings, are substantially closed to thereby obtain an acoustic sealed volume. However, it is also preferred that a static pressure equalizing vent or aperture is provided to the back volume. Here, the static pressure equalizing vent or aperture may be provided at the bottom part and/or the top part of the back volume, for example by having one or more backside openings left un-sealed or by having ventilation hole through the diaphragm.

According to an embodiment of the transducer of the invention the distance from the bottom to the top or opening of the cavity is in the range of 100-700 μm, such as in the range of 100-500 μm, such as about 300 μm.

The transducer of the present invention also covers embodiments, wherein one or more integrated circuits, such as one or more CMOS circuits, is/are formed in the front surface part of the die, with diaphragm and back plate being electrically connected to the integrated circuit(s) via electrical connections formed in or on the front surface part of the die.

For embodiments of the transducer of the invention having one or more integrated circuits on the front surface part of the die, then one or more contact pads may be formed in or on the front surface part of the die, said contact pad(s) being electrically connected to the integrated circuit(s) via one or more electrical connections formed in or on the front surface part of the die. It is preferred that at least part of the contact pads are compatible with SMD process techniques and are formed on a substantially plane part of the front surface part of the die.

However, for other embodiments of the transducer of the invention having one or more integrated circuits on the front surface part of the die, then one or more contact pads may be formed in or on the back surface part of the die, said contact pad(s) being electrically connected to the integrated circuit(s) via one or more electrical feedthroughs from the front surface part of the die to the back surface part of the die. Here, it is preferred that the back surface part of the die is substantially plane and at least part of the contact pads are compatible with SMD process techniques.

The transducer of the present invention also covers embodiments, wherein one or more integrated circuits, such as one or more CMOS circuits, is/are formed in the back surface part of the die, with the diaphragm and back plate being electrically connected to the integrated circuit(s) via electrical feedthroughs from the front surface part of the die to the back surface part of the die. Here, one or more contact pads may be formed in or on the back surface part of the die, said contact pad(s) being electrically connected to the integrated circuit(s) via one or more electrical connections formed in or on the back surface part of the die. Also here it is preferred that the back surface part of the die is substantially plane and at least part of the contact pads are compatible with SMD mounting techniques.

It is preferred that the transducer of the invention is formed on a die, which comprises a Si-based material. It is also preferred that the back plate and/or the diaphragm is/are formed by an electrically conductive Si-based material.

According to an embodiment of the transducer of the invention, the back plate may be substantially stiff with a number of back plate openings being provided through the back plate. It is also within an embodiment of the invention that the diaphragm is flexible.

According to a second aspect of the present invention there is provided, a method of manufacturing an acoustic micro-electrical-mechanical-system (MEMS) transducer on a single die based on a semiconductor material and having front and back surface parts opposed to each other, said method comprising:

a) forming a cavity in the die to thereby provide a back volume with an upper portion facing an opening of the cavity and a lower portion facing a bottom of the cavity; and b) forming a back plate and a diaphragm to extend across the cavity opening, said back plate and diaphragm being substantially parallel with an air gap there between and being integrally formed with the front surface part of the semiconductor substrate;

wherein the cavity is formed so that the bottom part of the cavity is bounded by the die.

According to an embodiment of the second aspect of the invention, the formation of the cavity or back volume, step a), may include the use of a combination of anisotropic dry etch and an isotropic dry etch. Here, the anisotropic dry etch may be performed from the backside of the die or substrate, whereby holes may be formed at the backside of the die. This may be followed by an isotropic dry etch, whereby a cavity or back volume may be formed in the die or substrate.

It is also within an embodiment of the second aspect of the invention that the formation of the cavity, step a), comprises: aa) forming a porous semiconductor structure to thereby define a cavity or back volume. Here, the semiconductor material may be Si, and the porous semiconductor structure may be formed by use of silicon anodization. According to embodiment of the second aspect of the invention, the porous semiconductor structure may be formed by silicon anodization from the backside of the die or substrate or wafer.

According to another embodiment of the second aspect of the invention, step aa) may comprise: forming a porous semiconductor structure to extend into the die from the front surface part of the die to the bottom part of the cavity to thereby define a cavity or back volume. Here, the formation of the porous semiconductor structure, step aa), may comprise the steps of:

aa1) providing a CMOS compatible Si substrate or wafer having a front side and a backside;

aa2) forming a highly doped conductive semiconductor layer on the backside of the Si substrate;

aa3) depositing a backside metal layer on at least part of the backside of the doped conductive semiconductor layer to thereby obtain an electrical contact to said conductive layer;

aa4) forming a protective front side layer, such as a Si-oxide layer, on part of the front side of the Si substrate;

aa5) mounting the Si substrate in an electrochemical cell;

aa6) forming a porous Si semiconductor structure by use of silicon anodization;

aa7) de-mounting the Si substrate from the electrochemical cell;

aa8) removal of the backside metal layer by etching; and aa9) removal of at least part of or all of the protective front side layer by etching.

It is preferred that the formation of the porous Si structure by use of anodization, step aa6), comprises:

applying an etching solution of a predetermined concentration to the front side of the substrate; and applying an external DC voltage within a predetermined voltage range between the backside metal layer and front side etching solution for a predetermined period of time to thereby form the porous structure. Here, the etching solution may comprise a HF solution being a solution of HF, water and ethanol, such as a 1:1:2 or 1:1:1 solution of $HF:H_2O:C_2H_5OH$. The DC voltage may be in the range of 1-500 mV and being adjusted so as to obtain a DC current density of 50 mA/cm$^2$ through the HF solution. Furthermore, the DC voltage may be applied for a time period in the range of 30-150 min, such as about 100 min.

According to an embodiment of the method of the second aspect of the invention, the formation of the back plate and the diaphragm, step b), may comprise depositing a conductive back plate layer and a conductive diaphragm membrane layer above the porous structure with each of said layers extending across the surface of the porous structure.

According to a preferred embodiment of the method of the second aspect of the invention, the formation of the back plate and the diaphragm may comprise the steps of:

- forming a first insulating layer above the surface of the porous structure;
- depositing a conductive back plate layer above the first insulating layer;
- forming openings in the back plate layer to thereby form a back plate;
- forming a second insulating layer above the back plate; and
- depositing a conductive diaphragm membrane layer above the second insulating layer.

According to an alternative embodiment of the method of the second aspect of the invention, the formation of the back plate and the diaphragm may comprise the steps of:

- forming a first insulating layer above the surface of the porous substrate;
- depositing a conductive diaphragm membrane layer above the first insulating layer;
- forming a second insulating layer above the membrane layer;
- depositing a conductive back plate layer above the second insulating layer; and
- forming openings in the back plate layer to thereby form a back plate. Here, the method may further comprise etching at least partly the second insulating layer from the front surface part through the back plate openings.

For embodiments of the methods of the second aspect of the invention, wherein a porous semiconductor structure has been formed, the formation of the cavity may further comprise the steps of: forming backside openings extending from the back surface part of the die to the lower portion of the porous structure, and etching the porous structure of the die from the back surface part through the backside openings. Here, the formation of the backside openings may comprise the steps of:

- forming a protective insulating backside layer on the backside of the die;
- patterning the protective insulating layer to thereby define areas of the backside openings; and
- backside etching at the defined areas through the back surface part of the die to the lower portion of the porous structure.

For embodiments of the method of the second aspect of the invention, wherein backside openings have been formed, the method may further comprise etching at least partly the first insulating layer from the back surface part through the backside openings. For embodiments wherein a back plate have been formed above the first insulating layer with a second insulating layer being formed above the back plate, then it is preferred that at least part of the first and second insulating layers are being etched via the back surface part through the backside openings and through the back plate openings. When the one or more etching processes through the backside openings have been finished, it is within an embodiment of the method of the first aspect of the invention to deposit a capping layer on the back surface part to thereby at least partly closing or acoustically sealing the backside openings.

According to the present invention there is also provided, in a third aspect, a method of manufacturing an acoustic micro-electrical-mechanical-system (MEMS) transducer on a single die based on a semiconductor material and having front and back surface parts opposed to each other, said method comprising:

- forming a porous semiconductor structure to extend into the die from the front surface part of the die, said porous structure defining a cavity volume and having a lower portion facing the back surface part of the die and a surface facing the front surface part of the die;
- forming a first insulating layer above the surface of the porous structure;
- depositing a conductive back plate layer above the first insulating layer;
- forming openings in the back plate layer to thereby form a back plate;
- forming a second insulating layer above the back plate;
- depositing a conductive diaphragm membrane layer above the second insulating layer;
- forming backside openings extending from the back surface part of the die to the lower portion of the porous structure;
- etching the porous structure of the die from the back surface part through the backside openings; and
- etching at least partly the first and second insulating layers from the back surface part through the backside openings and through the back plate openings.

According to the present invention there is also provided, in a fourth aspect, a method of manufacturing an acoustic micro-electrical-mechanical-system (MEMS) transducer on a single die based on a semiconductor material and having front and back surface parts opposed to each other, said method comprising:

- forming a porous semiconductor structure to extend into the die from the front surface part of the die, said porous structure defining a cavity volume and having a lower portion facing the back surface part of the die and a surface facing the front surface part of the die;
- forming a first insulating layer above the surface of the porous structure, depositing a conductive diaphragm membrane layer above the first insulating layer;
- forming a second insulating layer above the membrane layer;
- depositing a conductive back plate layer above the second insulating layer;
- forming openings in the back plate layer to thereby form a back plate;
- forming backside openings extending from the back surface part of the die to the lower portion of the porous structure;
- etching the porous structure of the die from the back surface part through the backside openings;
- etching at least partly the first insulating layer from the back surface part through the backside openings and through the back plate openings; and
- etching at least partly the second insulating layer from the front surface part through the back plate openings.

It is within embodiments of the methods of the third and fourth aspects of the invention, that the formation of the porous semiconductor structure comprises the steps of:

- providing a CMOS compatible Si substrate or wafer having a front side and a backside;
- forming a highly doped conductive semiconductor layer on the backside of the Si substrate;

depositing a backside metal layer on at least part of the backside of the doped conductive semiconductor layer to thereby obtain an electrical contact to said conductive layer;

forming a protective front side layer, such as a Si-oxide layer, on part of the front side of the Si substrate;

mounting the Si substrate in an electrochemical cell;

forming a porous Si semiconductor structure by use of silicon anodization, de-mounting the Si substrate from the electrochemical cell;

removal of the backside metal layer by etching; and removal of at least part of or all of the protective front side layer by etching.

It is within embodiments of the methods of the third and fourth aspects of the invention that the formation of the porous Si structure by use of anodization comprises the steps of:

applying an etching solution of a predetermined concentration to the front side of the substrate; and applying an external DC voltage within a predetermined voltage range between the backside metal layer and front side etching solution for a predetermined period of time to thereby form the porous structure. Here, the etching solution may comprise a HF solution being a solution of HF, water and ethanol, such as a 1:1:2 or 1:1:1 solution of $HF:H_2O:C_2H_5OH$; the DC voltage may be in the range of 1-500 mV and being adjusted so as to obtain a DC current density of 50 $mA/cm^2$ through the HF solution; and the DC voltage may be applied for a time period in the range of 30-150 min, such as about 100 min.

It is also within embodiments of the methods of the third and fourth aspect of the invention that the formation of the backside openings comprises the steps of:

forming a protective insulating backside layer on the backside of the die;

patterning the protective insulating layer to thereby define areas of the backside openings; and backside etching at the defined areas through the back surface part of the die to the lower portion of the porous structure.

Also for the methods of the third and fourth aspects of the invention it is preferred that when the one or more etching processes through the backside openings have been finished, then a capping layer may be deposited on the back surface part to thereby at least partly closing or acoustically sealing the backside openings.

Also for the methods of the present invention it is preferred that the die on which the MEMS transducer is formed comprises a Si-based material. Furthermore, the back plate and/or the diaphragm is/are preferably formed by an electrically conductive Si-based material, and the back plate may be substantially stiff with a large number of back plate through going openings, such as between 1000 and 50.000. The diaphragm is preferably flexible with a tension of a predetermined value. The diaphragm may comprise a substantially floating construction in accordance with the construction disclosed in U.S. Pat. No. 5,490,220.

Other features and advantages of the invention will be apparent from the following specification taken in conjunction with the following drawings.

DETAILED DESCRIPTION OF THE INVENTION

According to embodiments of the present invention, an acoustic MEMS transducer in form of a MEMS condenser microphone is manufactured on a single die semiconductor structure.

Representative semiconductor substrates for the manufacturing or fabrication of the condenser microphone according to the present invention comprise single-crystalline silicon wafers with <100> or <110> surface orientations.

Figure 1A:
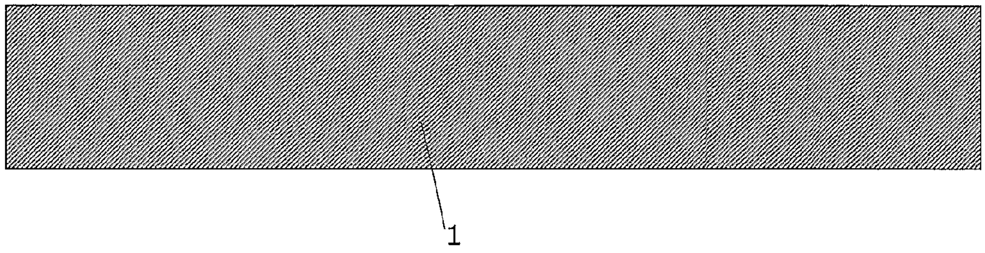
FIGS. 1*a*-1*n* are cross-sectional side views of a semiconductor structure during various steps of manufacturing an acoustic single die MEMS transducer according to embodiments of the methods of the present invention.
Figure 1B:
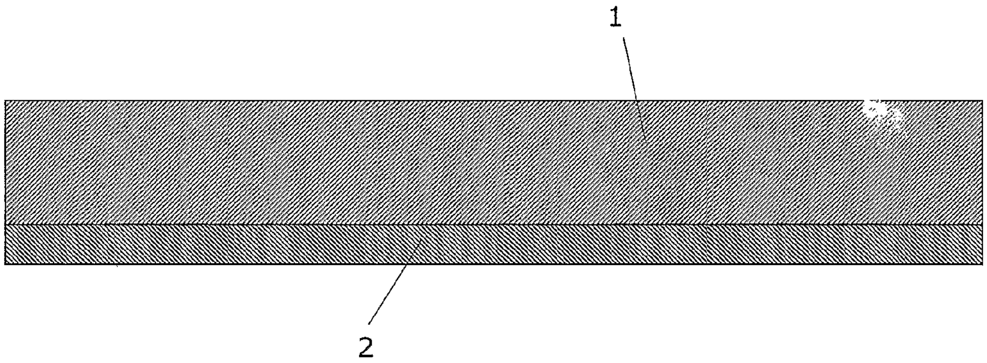
Figure 1C:
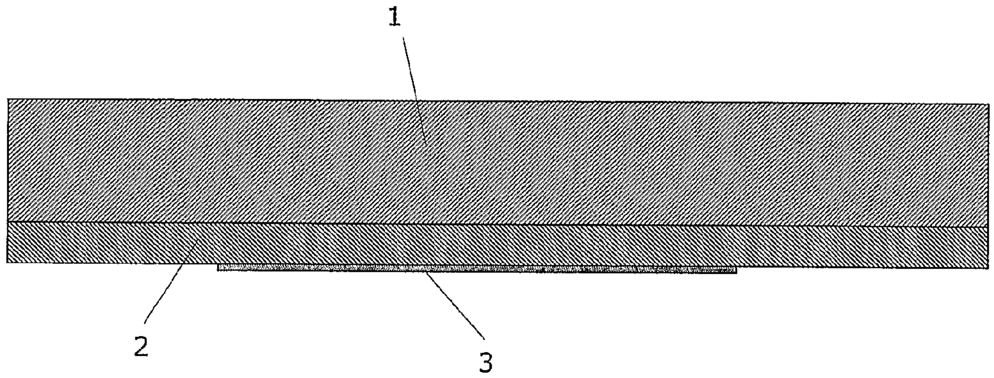
Figure 1D:
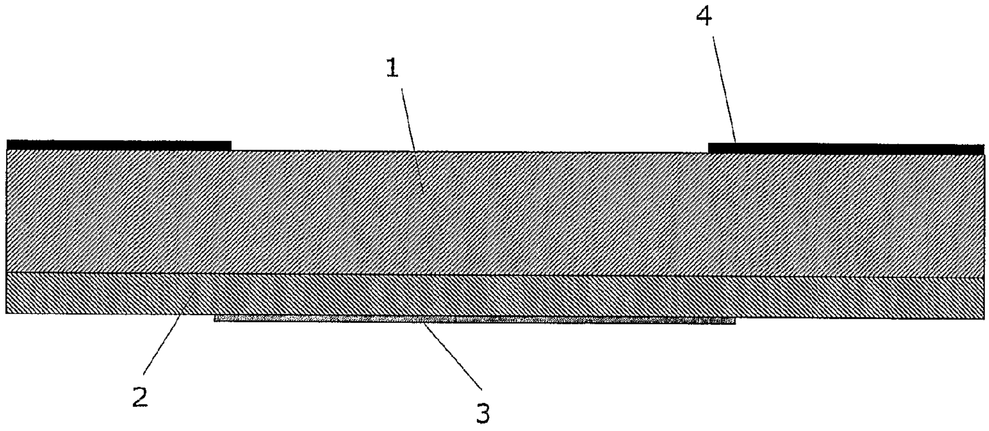
Figure 1E:
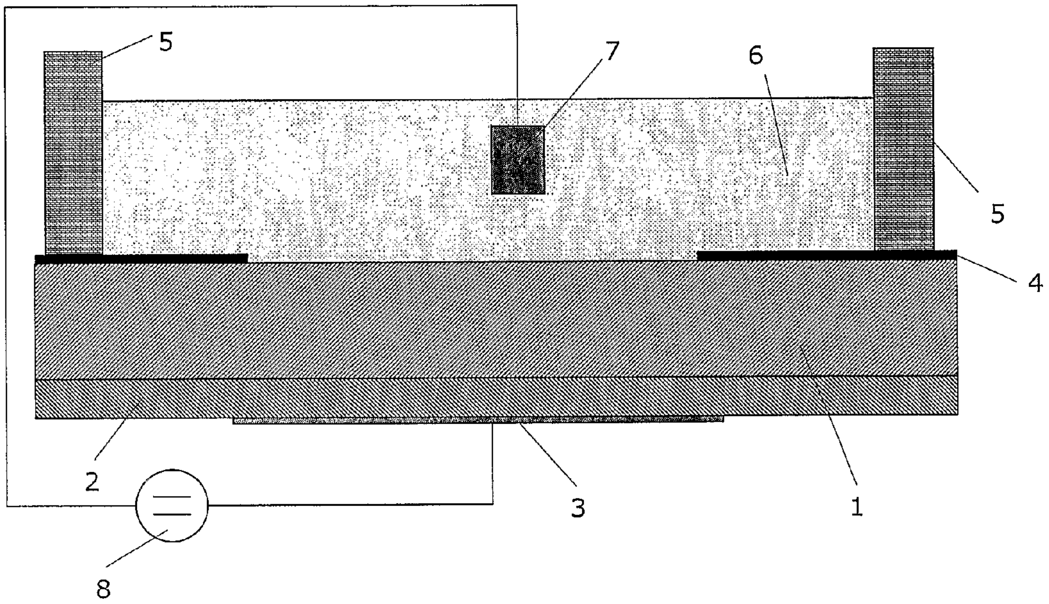
Figure 1F:
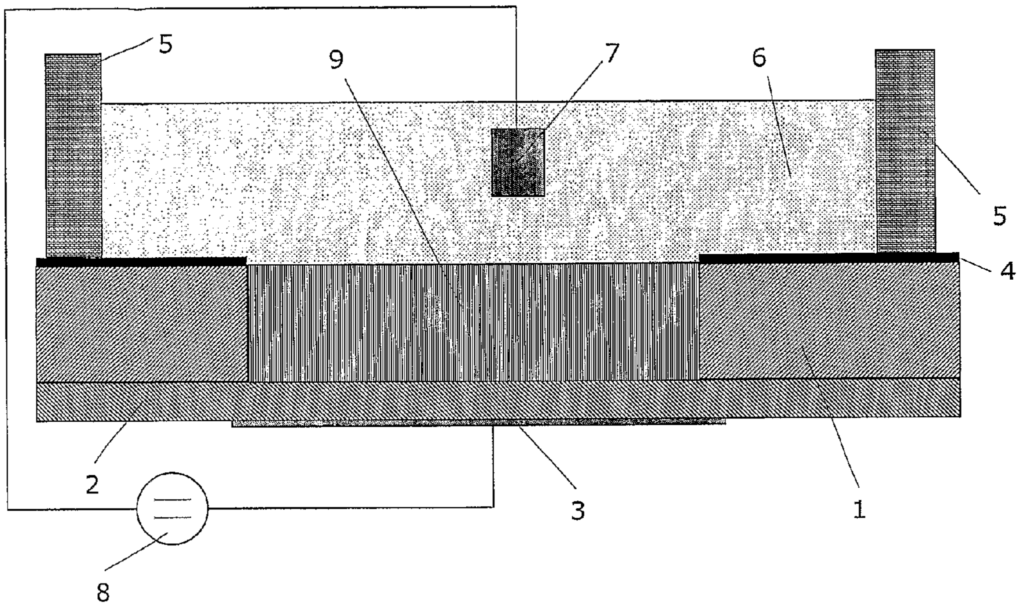
Figure 1G:
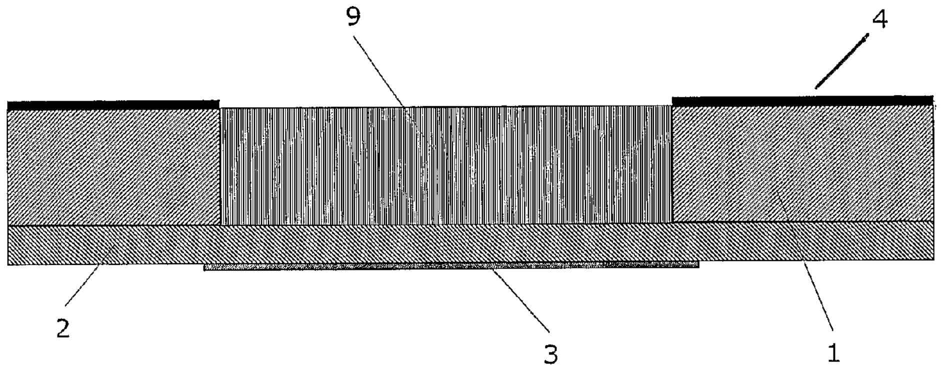
Figure 1H:
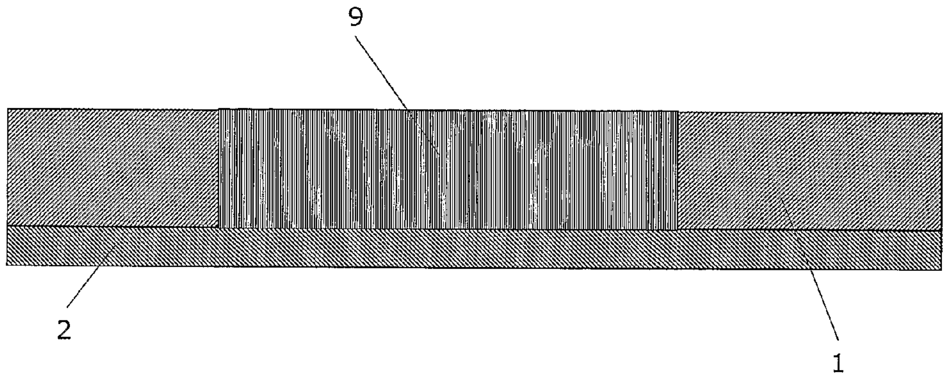
Figure 1I:
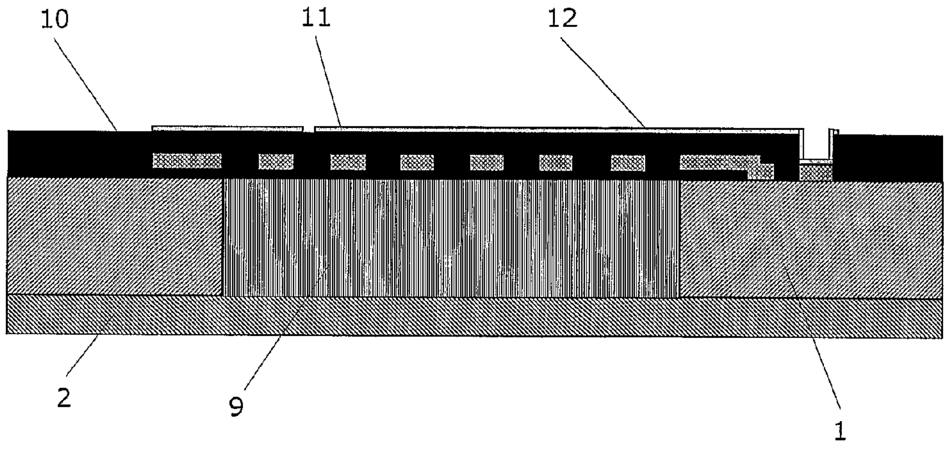
Figure 1J:
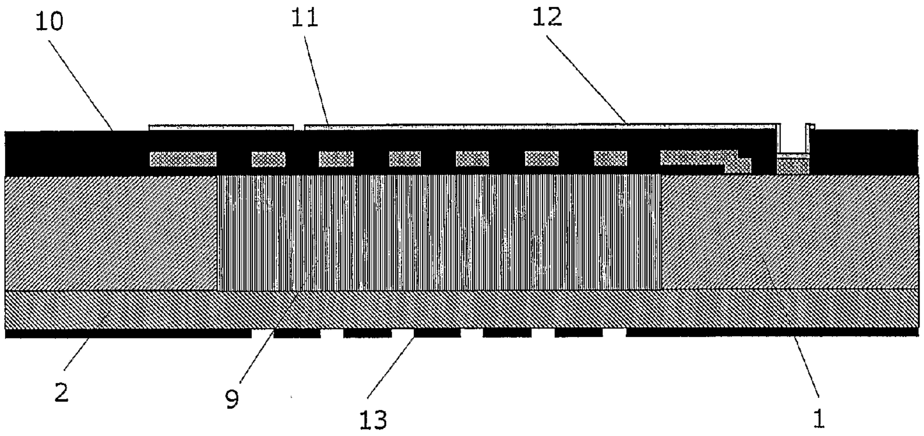
Figure 1K:
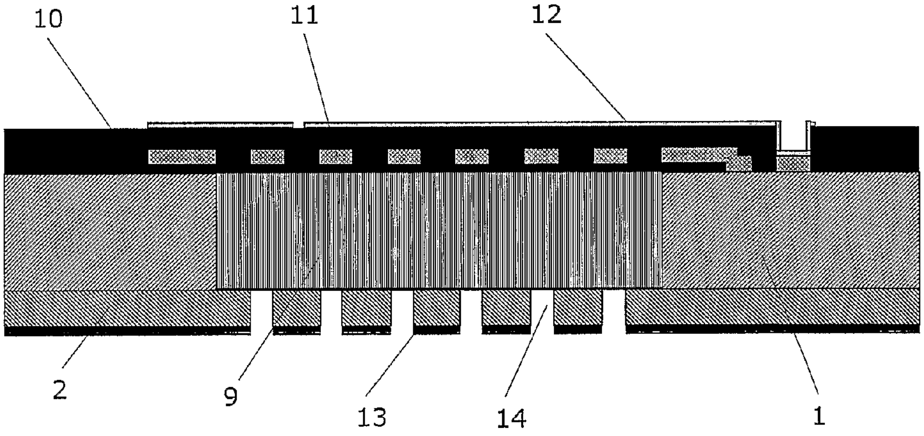
Figure 1N:
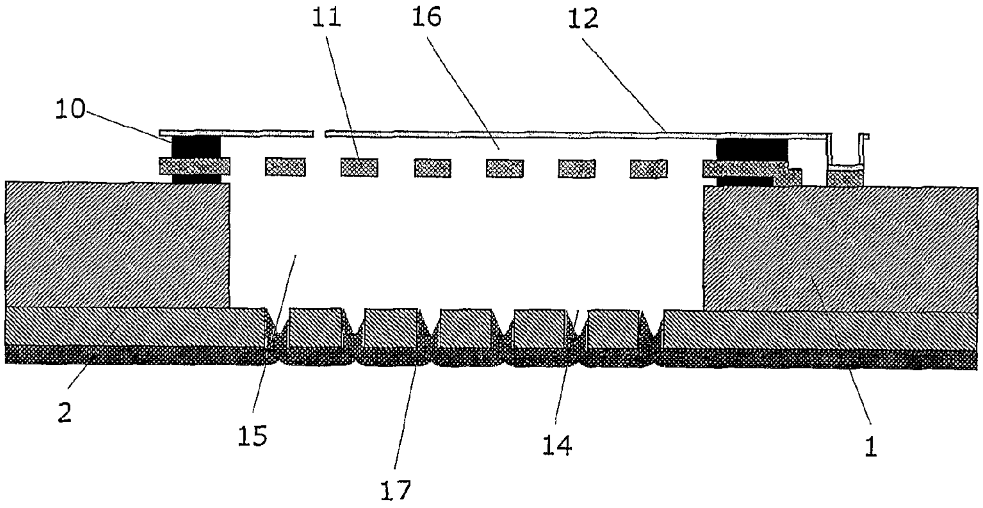

One method of manufacturing an acoustic transducer or condenser microphone consistent with the present invention is detailed below with reference to FIGS. 1*a*-1*n*, with FIGS. 1*a*-1*h* are illustrating various steps of porous semiconductor structure formation processes, FIG. 1*g* illustrating MEMS transducer structure formation processes, FIGS. 1*j*-1*l* illustrating back volume formation processes, FIG. 1*m* illustrating an etching process for releasing the transducer structure, while FIG. 1*n* illustrates a process for closing of the back volume, Porous Si Process Sequence, FIGS. 1*a*-1*n*

According to the preferred embodiments of the transducer of the present invention, a transducer back volume may be fabricated by forming a porous semiconductor structure and then etching the porous structure.

The first step is to provide a Si substrate 1, which preferably is compatible with one or more CMOS circuit processes, see FIG. 1*a*. Then, a highly doped conductive layer 2 is formed on the backside of the substrate, see FIG. 1*b*. The highly doped layer 2 is used as a contact layer for the porous Si formation, and may be obtained by deposition of B++ Epi or by implantation and diffusion of the dopant. Next, see FIG. 1*c*, a metal layer 3 (Al) is deposited on the backside for electrical contact during the porous Si formation; the metal layer 3 may be deposited for example by use of the lift-off technique. In order to mask the front side of the substrate 1 during the porous structure formation, the next steps are the deposition and patterning of a protection Si-oxide layer 4 on the front side and structured by use of a photoresist mask and HF etching, see FIG. 1*d*.

The Si substrate or wafer 1 is then mounted in an electrochemical cell for the porous Si formation, see FIG. 1*e*. The cell consists of a holder 5 separating the front side from the backside so that an etching solution 6 only can attack the front side of the substrate 1. Furthermore the substrate metal electrode 3 is connected to an electrode 7 of the cell via a voltage source 8. When the substrate or wafer 1 is mounted in the cell, the porous Si structure 9 is formed in the unprotected area by use of the externally applied DC voltage 8 and a HF solution 6, see FIG. 1*f*. This process is referred to as silicon anodization and by varying the DC voltage 8 and the HF concentration 6, the porosity level can be adjusted from 1 nm up to 1 μm.

It is preferred that the etching solution is a HF solution being a solution of HF, water and ethanol, such as a 1:1:2 or 1:1:1 solution of $HF:H_2O:C_2H_5OH$; the DC voltage 8 may be in the range of 1-500 mV and may be adjusted so as to obtain a DC current density of 50 $mA/cm^2$ through the HF solution. The DC voltage may be applied for a time period in the range of 30-150 min, such as about 100 min, to thereby obtain a desired thickness of the porous structure, which may be in the range of 100-500 μm, or about 300 μm.

After formation of the porous Si structure 9, the substrate 1 is de-mounted from the electrochemical cell, see FIG. 1*g*, and the Al metal electrode 3 is etched in phosphoric acid solution and the protection layer 4 is etched in HF, see FIG. 1*h*.

The formation of porous silicon structures is discussed in Z. M Rittersma: "Microsensor Applications of Porous Silicon", which is hereby included by reference.

MEMS Structure Formation

Now the porous Si structure 9 has been formed, and in order to obtain a MEMS condenser microphone, a back plate and a diaphragm have to be formed. This formation is illustrated in FIG. 1*i*, which shows the deposition and structuring of layers for the MEMS condenser microphone. A first Si-oxide layer 10 is formed on the front side of the substrate 1, then a conductive Si based material, e.g. SiGe, is deposited and structured to obtain a back plate 11, next a second Si-oxide layer 10 is formed on top of the back plate 11 and the first Si-oxide layer 10, and a conductive Si based material, e.g. SiGe, is deposited and structured on top of the second Si-oxide layer 10 to form the diaphragm 12. In embodiments of the invention where the single die comprises CMOS circuitry, it is important that all processes associated with formation of the MEMS structure are low temperature processes, to avoid any influence on the CMOS circuit. A more detailed description and illustration of the formation of the back plate 11 and diaphragm 12 is given below in connection with FIGS. 2*j*-2*m*. From FIG. 1*i* it is seen that a ventilation hole may be formed in the diaphragm in order to obtain a static pressure equalizing vent or opening. The back plate 11 and the diaphragm 12 may also both be electrically conductive connected to the front part of the substrate 1, where electrically circuitry may be formed for handling the signal output from the diaphragm 12 and back plate 11.

Back Volume Formation

In order to obtain the condenser microphone, then the back volume has to be formed in the porous Si structure 9. This is illustrated in FIGS. 1*j*-1*l*. FIG. 1*j* illustrates that a Si-oxide masking layer 13 is deposited on the backside of the Si structure and further being patterned by the use of photoresist and HF etching. Next, a backside etching is performed to form backside openings or channels 14 extending from the backside of the Si structure to the porous Si region 9, see FIG. 1*k*. This is followed by a sacrificial etch of the porous Si region 9 using a KOH (potassium hydroxide) based solution to form the back volume 15, see FIG. 11. The front side has to be protected during this etch with a KOH resistant polymer layer or photoresist.

MEMS Release Process

The Si-oxide layers 10 used during the formation of the back plate 11 and the diaphragm 12, where the second Si-oxide layer defines the microphone air gap 16, and the protection Si-oxide layer 13 are now etched in vapour HF in order to release the MEMS microphone structure, see FIG. 1*m*. The HF reaches the oxide between diaphragm 12 and back plate 11, through the backside etch channels 14 in the backside. The microphone air gap 16 may have a height between 1 and 20 μm such as between 2 and 5 μm for miniature embodiments suitable for telecom and hearing aid applications.

Back Volume Closing

The backside openings or channels 14 may be left open to form a directional microphone. However, according to a preferred embodiment the backside channels 14 are sealed to form a substantially closed back volume 15 and form an omni directional microphone. This is illustrated in FIG. 1*n*, where the backside channels are closed by deposition of a Si-oxide layer 17 into the backside channels 14, using an APCVD (Air Pressure Chemical Vapour Deposition) process. Instead of Si-oxide, other materials like thick spin-on polymers may be used to close the backside etching channels 14. A static pressure equalization hole may be formed in the diaphragm or in the backside, for example by leaving one or more of the backside channels 14 open.

Embodiments of the Invention Including CMOS Circuitry

A silicon microphone manufactured as described above and illustrated in FIGS. 1*a*-1*n*, has typically a very low signal output and acts as a signal source with a very high impedance of essentially capacitive nature. In order to obtain a high signal to noise ratio and/or immunity against EMI noise, it is important that the length of the electrical signal paths from the microphone output to the amplifying CMOS circuitry are as short possible with as small parasitic capacitance as practical to minimize signal loss. The present embodiments of the invention provides a solution to this problem by having amplifying circuitry formed on the single die, which also forms the microphone. A first embodiment of such a solution is illustrated in FIGS. 2*a*-2*v*, which show cross-sectional side views of a semiconductor structure during various steps of manufacturing of a single die condenser microphone with CMOS circuitry formed on the die.

Figure 2A:
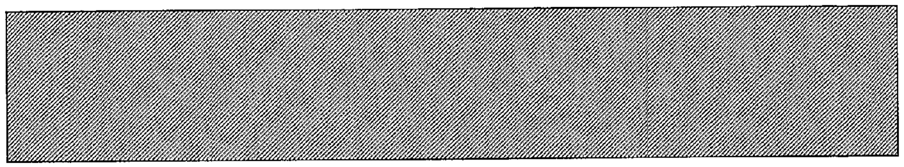
FIGS. 2*a*-2*v* are cross-sectional side views of a semiconductor structure during various steps of manufacturing an acoustic single die MEMS transducer according to a first embodiment of the present invention having CMOS circuitry formed on the die.
Figure 2B:
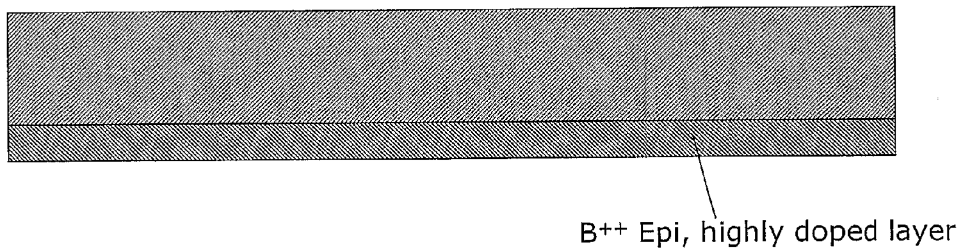
Figure 2C:
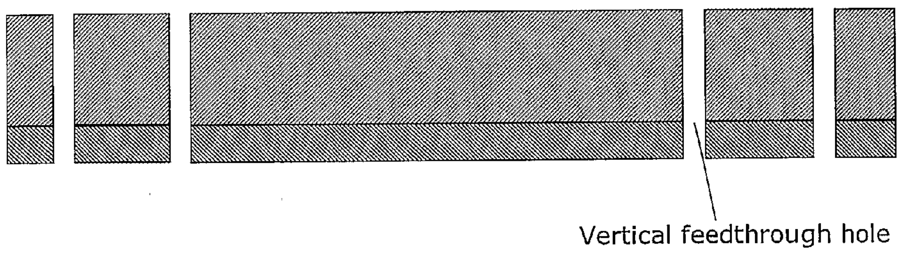
Figure 2D:
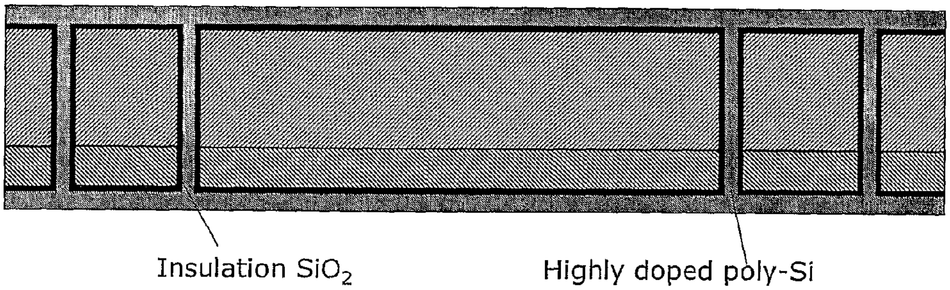
Figure 2E:
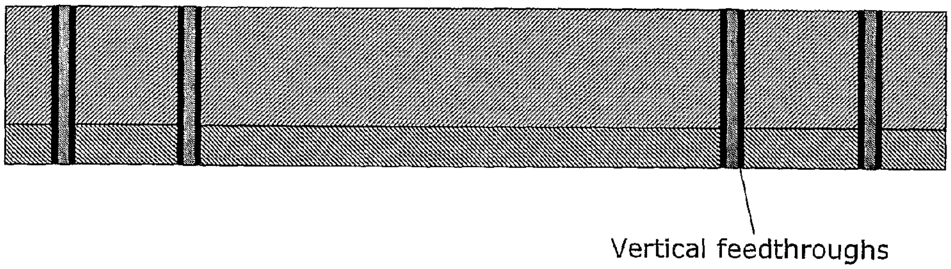
Figure 2F:
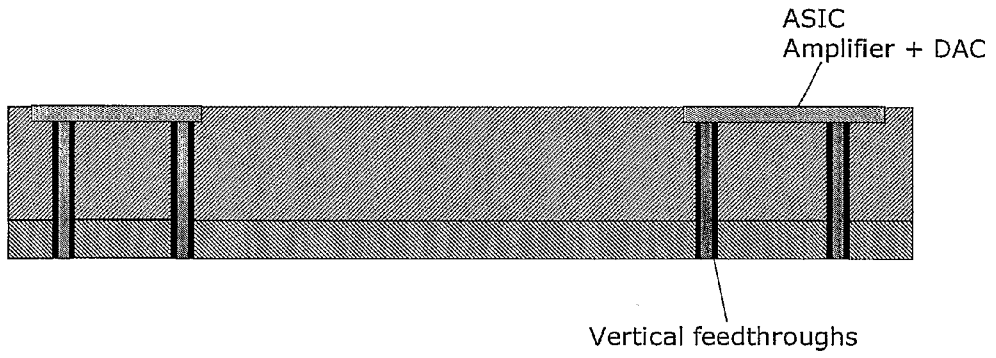
Figure 2G:
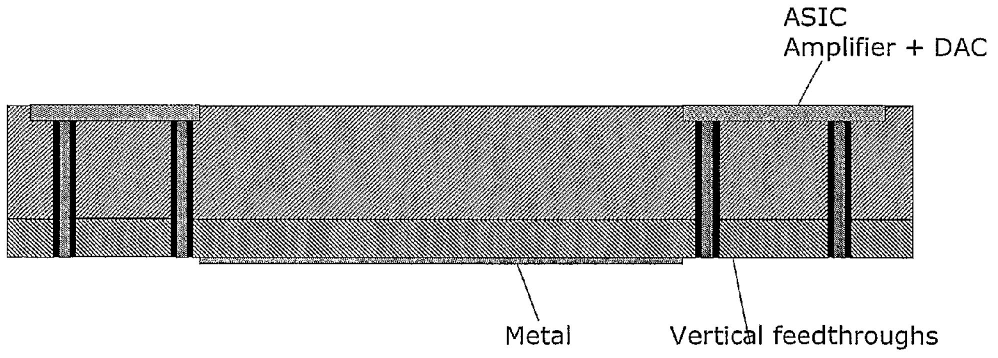
Figure 2H:
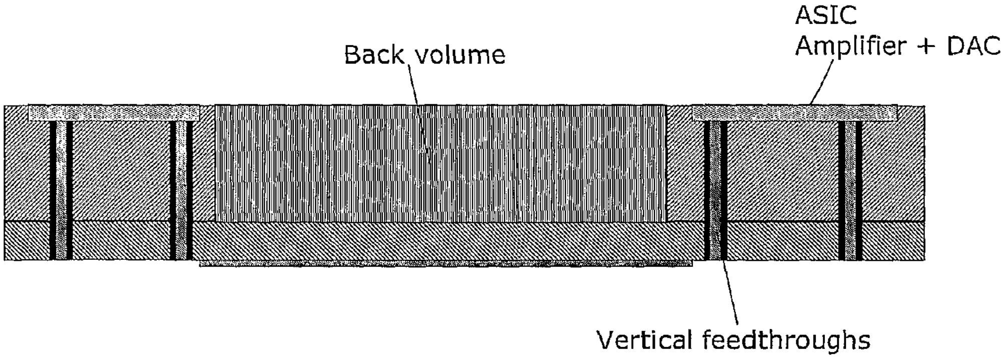
Figure 2I:
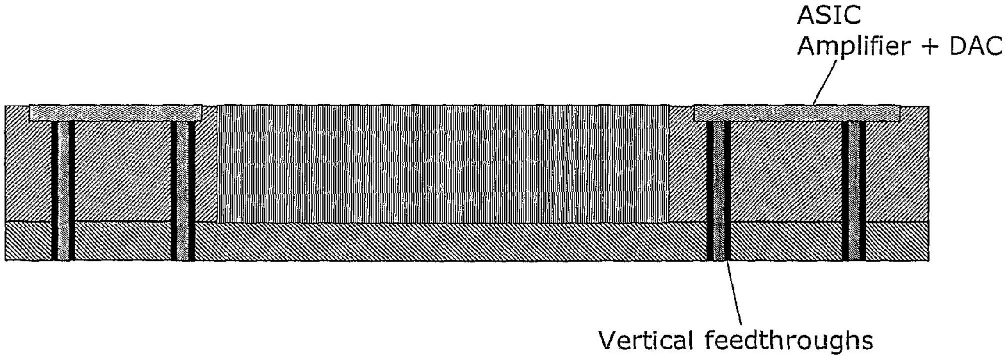
Figure 2J:
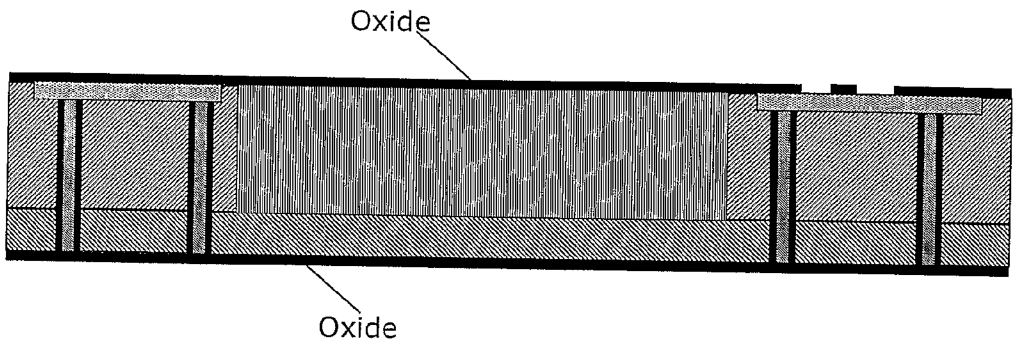
Figure 2K:
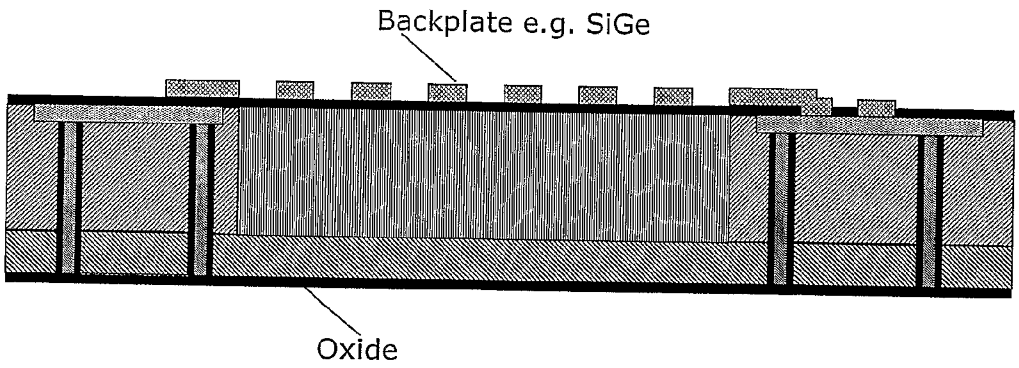
Figure 2L:
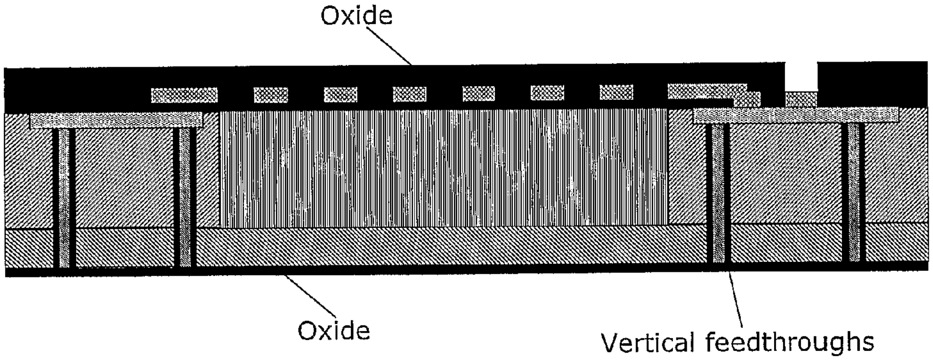
Figure 2M:
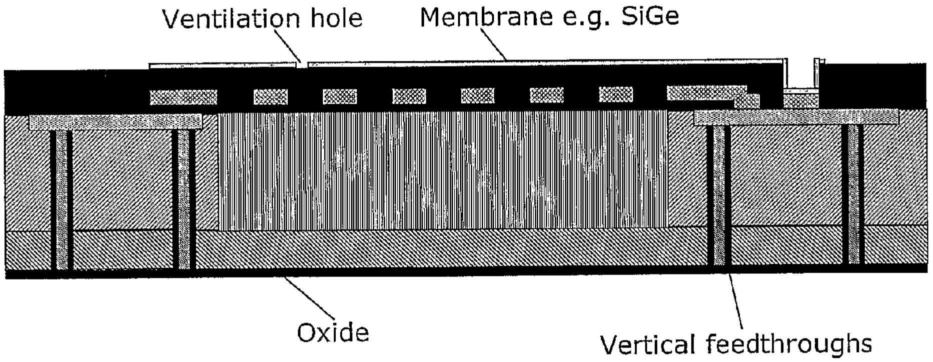
Figure 2N:
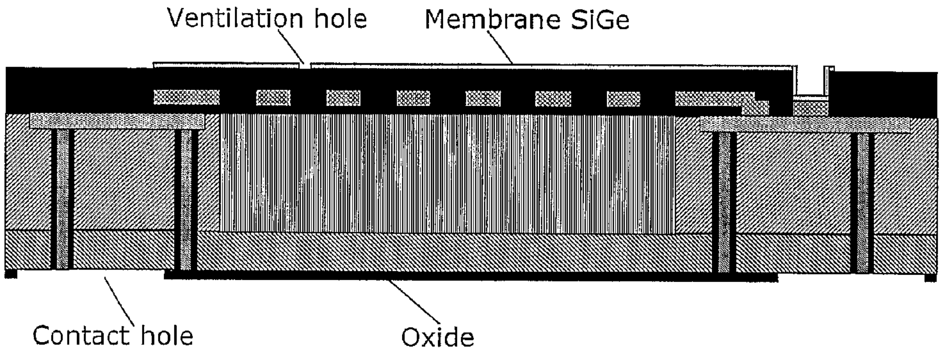
Figure 2O:
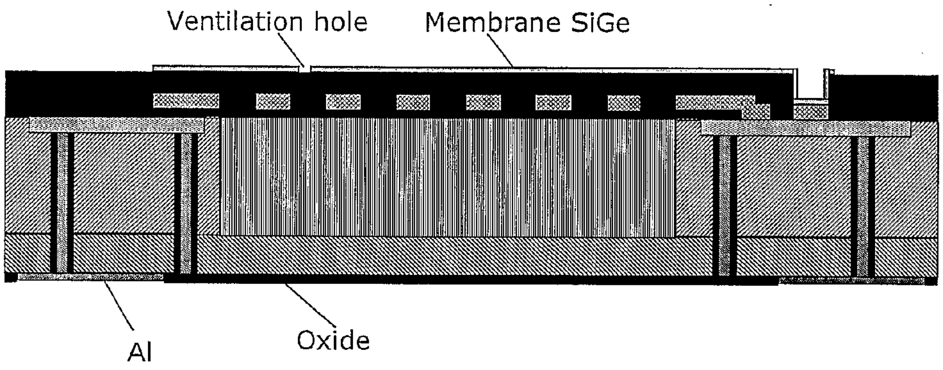
Figure 2P:
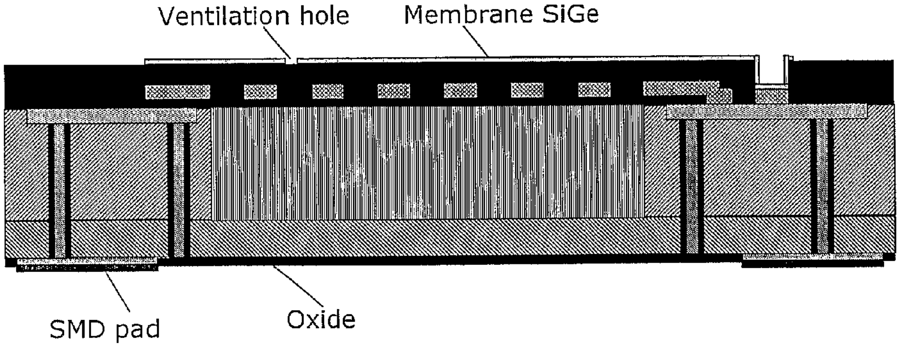
Figure 2Q:
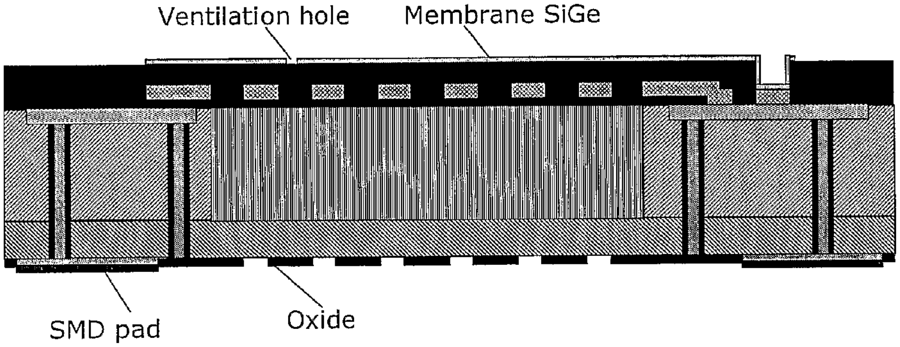
Figure 2R:
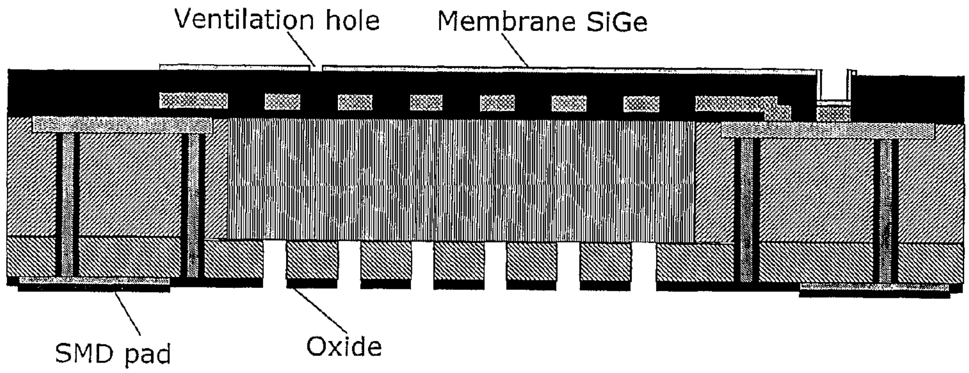
Figure 2S:
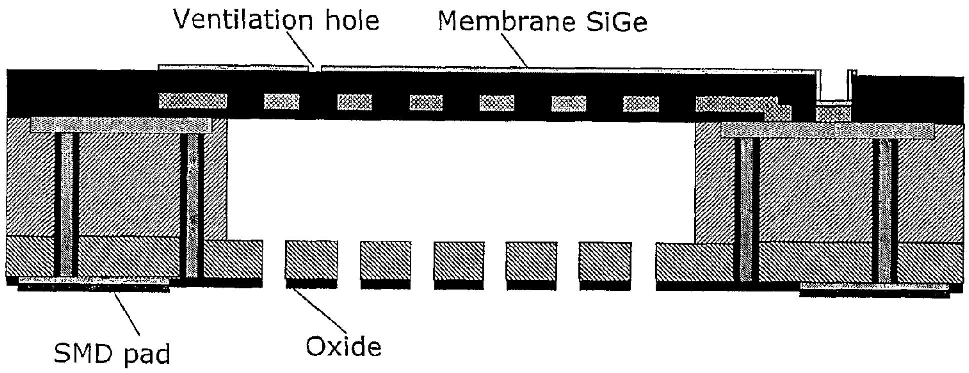
Figure 2T:
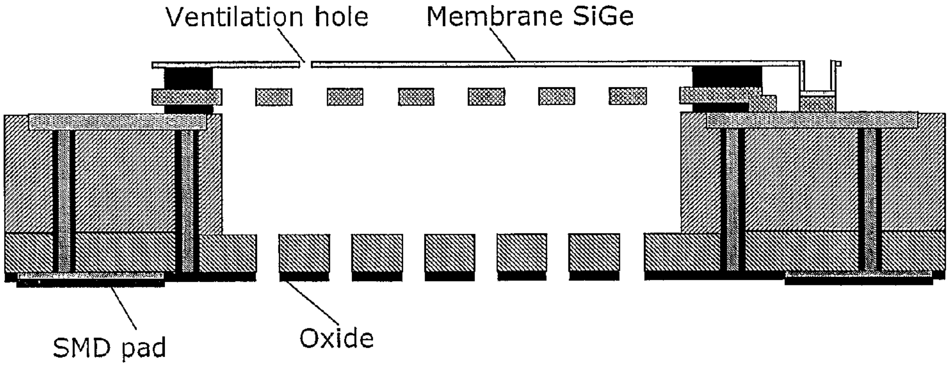
Figure 2U:
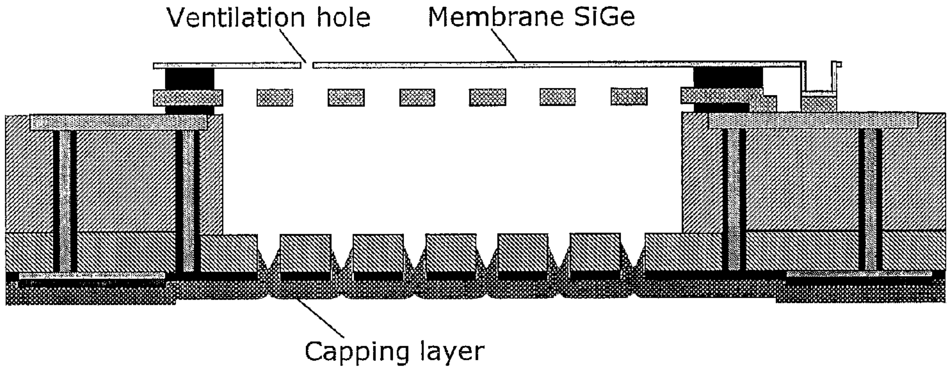
Figure 2V:
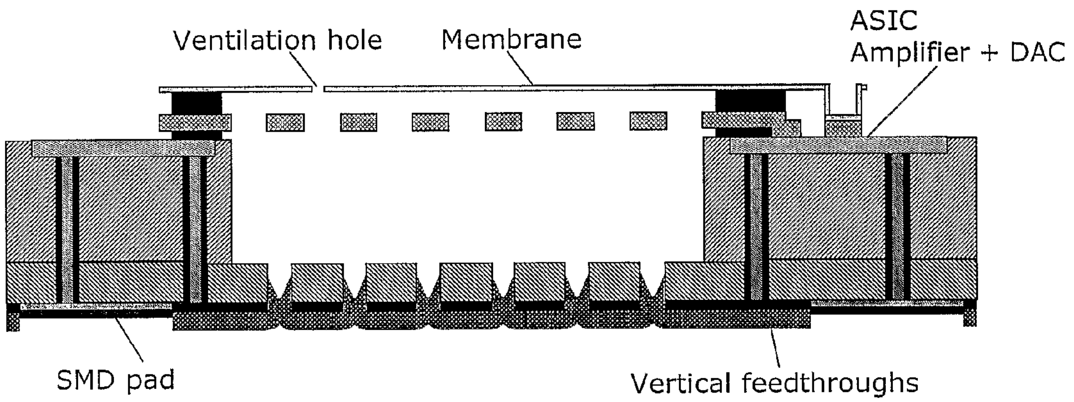

The steps used in FIGS. 1*a*-1*n* are also used for the embodiment illustrated in FIGS. 2*a*-2*v*, but additional steps are included in order to form the CMOS circuitry and an electrical contact structure.

The first step is to provide the CMOS compatible Si substrate, see FIG. 1*a*. Then, a highly doped conductive layer is formed on the backside of the substrate, see FIG. 2*b*. The highly doped layer is used as a contact layer for the porous Si formation, and may be obtained by deposition of B++ Epi.

Vertical Feedthrough Integration

Next, vertical feedthroughs are formed in the substrate in order to obtain electrical signal paths from the front side of the Si structure or die to the backside. First, deep reactive ion etching, DRIE, of vertical through holes are performed, see FIG. 2*c*. Then, see FIG. 2*d*, an insulating layer of $SiO_2$, Si-Oxide, is deposited and the remaining part of the through holes is filled with a conductive layer of highly doped poly-Si. Finally, see FIG. 2*e*, back etching and polishing of the poly-Si and $SiO_2$ on the backside is performed, and electrical feedthroughs are obtained through the substrate via the doped poly-Si.

CMOS Integration

The next process steps provide the die with amplifying circuitry such as a CMOS circuit, which may include an analogue and a digital part, and which may include a low noise microphone preamplifier and an analogue to digital converter, ADC such as an oversampled sigma-delta. The CMOS circuit may furthermore comprise a voltage pump or doubler coupled to a low noise voltage regulator to provide a DC bias voltage of predetermined value between the back plate 11 and the diaphragm 12. This is illustrated in FIG. 2*f*, where an ASIC circuit is formed on top of the wafer with the integrated vertical feedthroughs. The ASIC circuit is formed by use of a suitable CMOS process. More than one CMOS circuits may be formed on top of the wafer. The metallization layers of the CMOS process are used to make contact to the feedthroughs.

Local Formation of Porous Silicon Defining the Back Volume

The next process steps include the formation of the porous silicon structure, which have been described in connection with FIGS. 1*c*-1*h*. This process starts with the deposition of contact metal (Al) on the backside, see FIG. 2*g*. The formation of the porous silicon structure includes, see FIG. 2*h*, formation of porous silicon using HF (hydrofluoric acid) in an electrochemical cell with protection of CMOS circuitry and backside being provided. The steps of formation of the porous silicon structure further include removing of the backside contact metal used in the electrochemical cell process.

Processing of MEMS Microphone Structure on Top of Porous Silicon Area

After the formation of the porous Si structure, a back plate and a diaphragm have to be formed. This formation is illustrated in FIGS. 2*j*-2*m*. A first low temperature Si-oxide insulation layer is formed on the front side and the backside of the substrate, see FIG. 2*j*, then a low temperature conductive Si based material, e.g. SiGe or sandwich layer with silicon nitride, is deposited and structured to obtain the back plate, see FIG. 2*k*. From FIGS. 2*j* and 2*k* it is seen that contact holes are formed in the first insulation layer above the CMOS circuitry, and that the material forming the back plate is also deposited to fill out these contact holes, whereby an electrical conductive contact is established via a first part of the contact holes between the CMOS circuitry and the back plate. A second part of the contact holes are used to establish an electrical contact between the CMOS circuitry and the diaphragm, as illustrated in FIG. 2*m*. When the back plate is formed, then a second low temperature Si-oxide insulation layer is formed on top of the back plate and the first Si-oxide layer, see FIG. 21, and openings are provided in the second insulation layer to the second part of the contact holes. Finally a low temperature conductive Si based material, e.g. SiGe or sandwich layer with silicon nitride, is deposited and structured on top of the second Si-oxide layer to form the diaphragm. From FIG. 2*m* it is seen that a ventilation hole may be formed in the diaphragm in order to obtain a static pressure equalizing vent or opening.

Backside Metal

In order to obtain an electrical contact from the backside of the die to the feedthroughs and thereby to the circuitry on the front side of the die, then contact hole openings are provided in the insulating backside oxide layer, see FIG. 2*n*. This is followed by deposition and patterning of Al backside metal layer, see FIG. 2*o*, followed by the deposition of an underbump metallization (UBM) consisting of Ni and Au or Ni, Pd and Au or Ni and Pd, see FIG. 2*p*, to thereby make the electrical backside contacts compatible with surface mount device, SMD, process techniques.

Backside Structure for Sacrificial Etch

In order to obtain backside openings from the backside of the die and to the bottom of the porous Si region, then the insulating backside oxide layer is patterned by the use of photoresist and HF etching to define the areas for etching of the backside openings, see FIG. 2*q*. Next, a backside etching is performed by reactive ion etching, RIE, to form the backside openings or channels extending from the backside of the die or Si structure to the porous Si region, see FIG. 2*r*.

Sacrificial Etch

Now a sacrificial wet etch of the porous Si region using KOH or TMAH (tetramethylammonium hydroxide) etching is performed to form the back volume, see FIG. 2*s*. The front and backsides are protected during this etch with an etch resistant polymer layer or photoresist.

The porous wet etch is followed by a vapour HF etch of sacrificial oxide, whereby the first and second oxide layers below and above the back plate are etched to thereby release the MEMS microphone structure, see FIG. 2*t*. Furthermore, a SAM coating of membrane and back plate is provided, that is a hydrophobic layer being a self-assembled monolayer (SAM) is deposited on the membrane and back plate, where the SAM coating of the back plane may be performed through the backside openings and/or through the ventilation hole in the diaphragm.

Closing of Back Volume

The backside openings or channels may be left open in order to form a directional microphone. However, according to a preferred embodiment the backside channels are closed to seal the back volume and obtain an omni directional microphone. This is illustrated in FIG. 2*u*, where the backside channels are closed by deposition of a capping Si-oxide layer into the backside channels, using an APCVD (Air Pressure Chemical Vapour Deposition) process. Instead of Si-oxide, other materials like thick spin-on polymers may be used to close the backside etching channels. If there is no ventilation hole formed in the diaphragm in order to obtain a static pressure equalizing vent or opening, then such a ventilation hole may be formed in the backside, for example by having one or more backside channels or openings left open. Finally, openings to the backside electrical contacts pads are provided through the sealing oxide layer by use of reactive ion etching, RIE, or wet etching.

Figure 5:
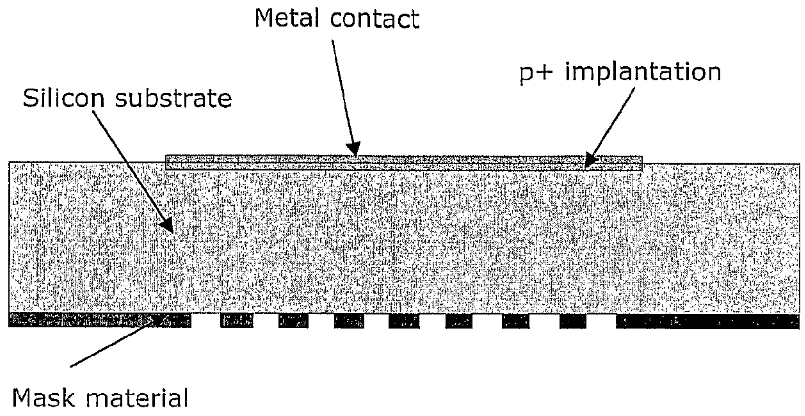
FIGS. 5-7 are cross-sectional side views of a semiconductor structure during various steps of forming a porous silicon structure from the backside of a wafer by use of anodization.
Figure 6:
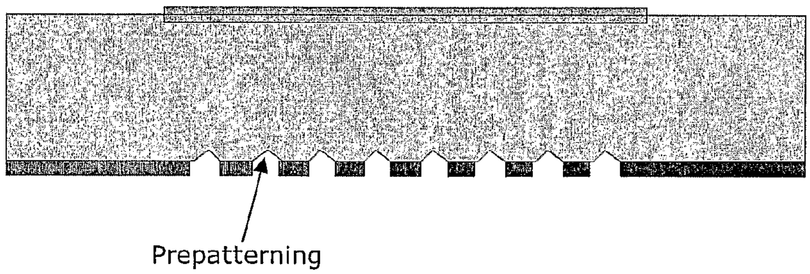
Figure 7:
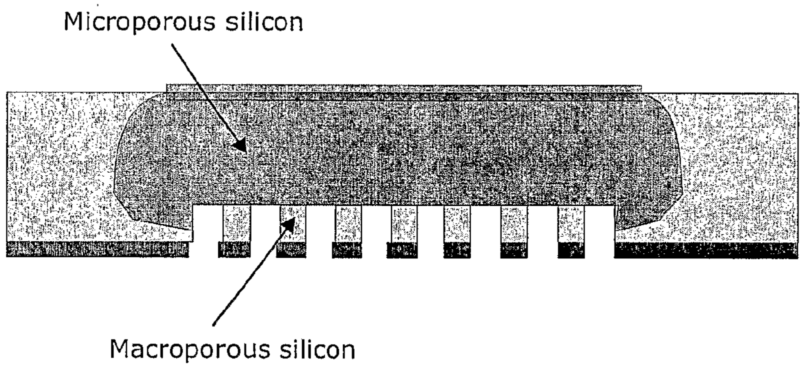

Porous Silicon Formed from Backside of Wafer by Anodization, FIGS. 5-7

The present invention also covers embodiments, wherein a transducer back volume may be fabricated by forming a porous silicon structure from the backside of a wafer by use of an anodization process as illustrated by FIGS. 5-7. This process may be used in connection with fabrication process 1, replacing the processes illustrated from FIGS. 1*a*-*h* and in fabrication process 2, replacing the processes illustrated from FIGS. 2*g*-2*h* and in fabrication process 3 used for the die illustrated in FIG. 3. This implies that no etching has to be done to open the bottom floor of the cavity.

The front side of the wafer is implanted with p+ and a metal layer contact is deposited. If CMOS circuitry is included on the wafer these layers may come from the CMOS process. Then a mask for anodization is made on the backside of the wafer. The wafer now looks like illustrated in FIG. 5

A pre-patterning of the silicon wafer is performed using a KOH or TMAH etch through the mask openings. This is illustrated in FIG. 6.

Porous silicon formation in the pre-patterned areas is performed by adjusting current density and electrolyte composition in order to obtain macro-porous silicon of about 50 μm thickness into the substrate. The macroporous silicon may have a silicon matrix with wall thickness of about 1 μm. Then the anodization current density and/or the electrolyte composition is changed so that micro-porous silicon is formed from the end of the macro-porous silicon region to the front surface of the wafer. This is illustrated in FIG. 7. The nano-porous silicon has a silicon matrix with a wall thickness of about 1 nm.

Due to the difference in wall thickness it is possible to selectively etch the micro-porous silicon without etching the macro-porous silicon as described above. After micro-porous silicon removal and sacrificial oxide removal, the macro-porous silicon structure can be closed using APCVD oxide or spin-on of a polymer as previously described.

Frontside Anodization through n+ Mask—n+ Implanted Monocrystalline Silicon Forming Backplate, FIGS. 8 and 9

The present invention also covers an alternative embodiment, wherein a transducer back volume may be fabricated by forming a porous silicon structure from the front-side of a wafer by use of anodization as illustrated by FIGS. 8 and 9. By using this process the backplate is formed by monocrystalline silicon during the anodization process. This process may be used in connection with process 1, replacing the steps illustrated by FIGS. 1*c*-1*h*. In this case no backplate is deposited and patterned in FIG. 1*i*. This process may also be used in connection with process 2 where it replaces the steps illustrated by FIGS. 2*g*-2*j*. In this case no backplate is deposited in FIG. 2*k*. Finally it may also be used for the fabrication of the die illustrated in FIG. 3.

Figure 8A:
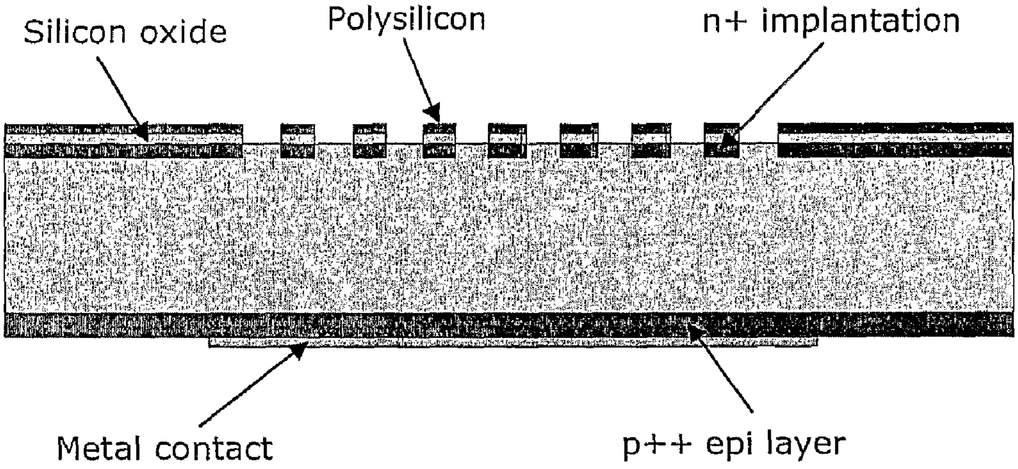
FIGS. 8*a*-9*b* are cross-sectional side views of a semiconductor structure during various steps of forming a porous silicon structure from the frontside of a wafer by use of anodization.
Figure 8B:
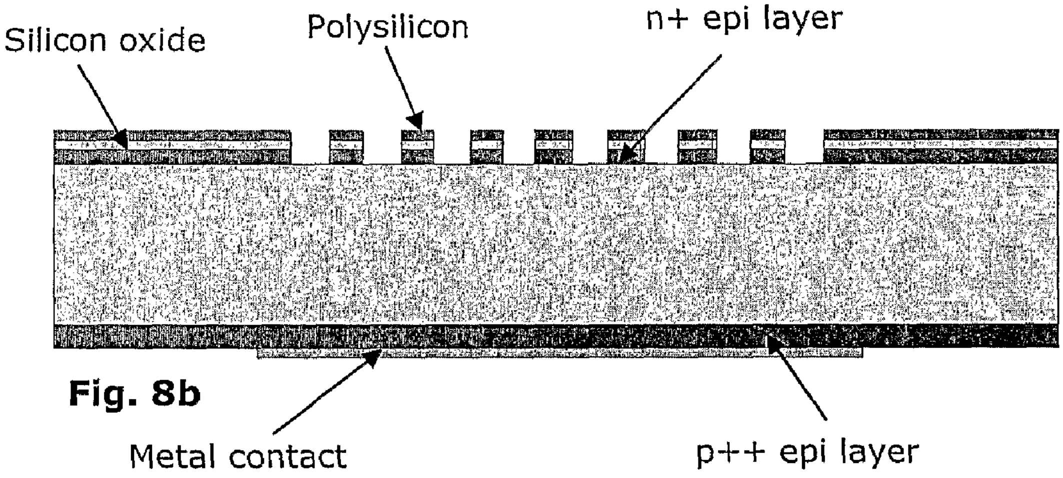

An Epi B++ layer is deposited on the backside of the wafer, followed by a metal contact layer deposition. Then a mask for anodization is made on the frontside of the wafer. This may consist of a n+ implantation, $SiO_2$ deposition, and PolySi deposition as illustrated in FIG. 8*a*, or, alternatively, of a n+ epilayer deposition, $SiO_2$ deposition, and PolySi deposition as illustrated in FIG. 8*b*. Then the masking layer is patterned as the backplate.

Figure 9A:
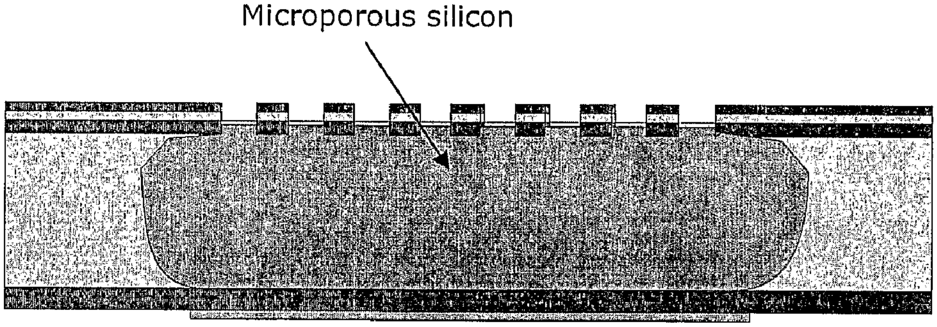
Figure 9B:
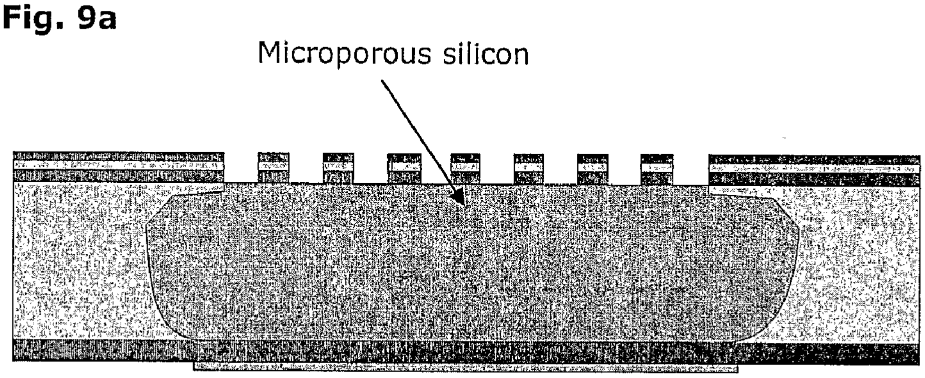

Formation of porous silicon is performed by anodization, forming a layer through the wafer that can be made to stop on the p++ epi layer. This results in an under etch/anodization of the n+ implants, which are not anodized. The wafer now looks as depicted in FIG. 9*a* in the case of a monocrystalline backplate formed from the n+ implanted layer. Alternatively the wafer looks as in FIG. 9*b* in the case of a backplate formed from the n+ epi layer.

Back Volume Formation Using a Combination of an Anisotropic Dry Etch and an Isotropic Dry Etch, FIGS. 10-15

The present invention further covers embodiments, wherein the back volume is formed in a CMOS compatible post processing step following the formation of the MEMS structure. The CMOS compatible processing steps may comprise: a highly anisotropic dry etch from the backside in order to open holes in the backside of the die. A following isotropic dry etch step forms the back volume.

Figure 10:
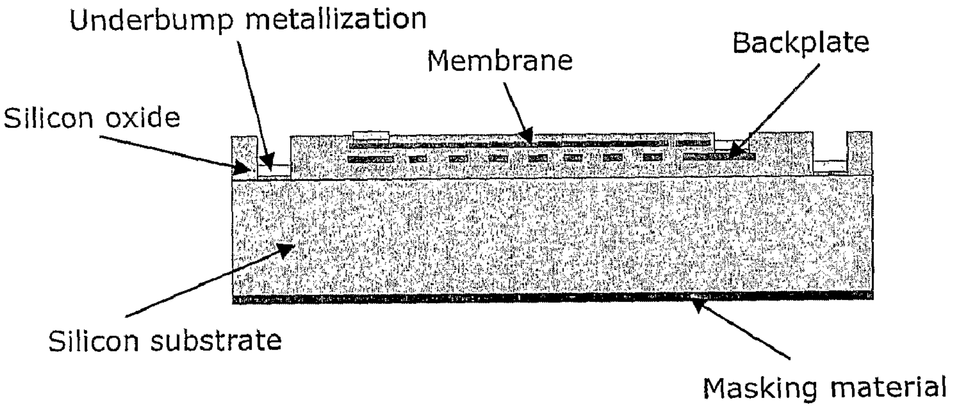
FIGS. 10-15 are cross-sectional side views of a semiconductor structure during various steps of cavity formation according to an embodiment of the invention.

Such a process is illustrated in FIGS. 10-15, as described in the following:

FIG. 10: A masking layer is deposited on the backside of a wafer, which previously has been processed with the membrane and backplate structures. It is also possible that the wafer has CMOS structures on it.

Figure 11:
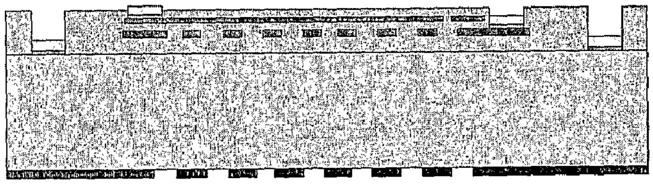
Figure 12:
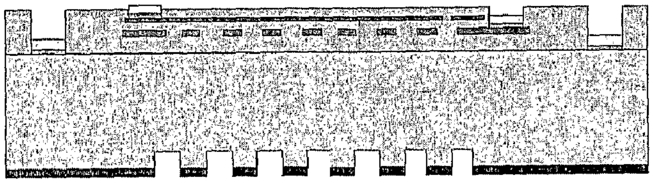

FIG. 11: The masking layer is patterned using photolithography and an etching step FIG. 12: Holes are made using an anisotropic etch such as a deep reactive ion etch process.

Figure 13:
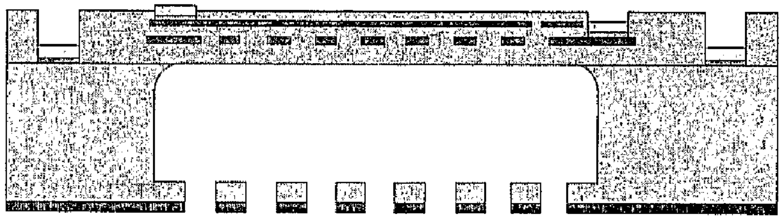

FIG. 13: An isotropic etch is performed in order to expand the cavity. The etch stops on the silicon oxide layer below the backplate structure.

Figure 14:
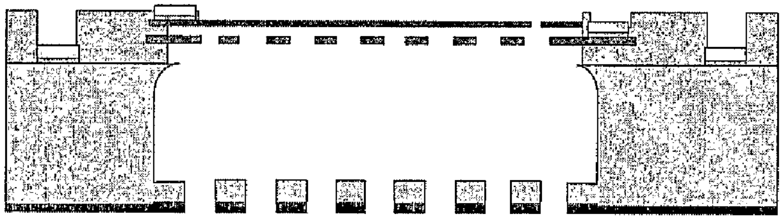

FIG. 14: A vapour phase hydrofluoric acid etch is performed to release the membrane and backplate structures.

Figure 15:
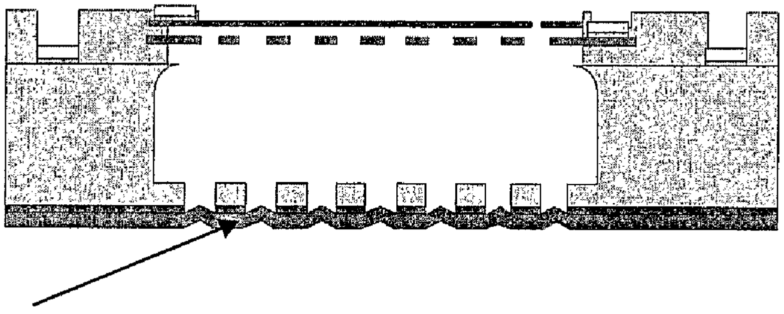

FIG. 15: The holes in the bottom of the cavity are closed using an APCVD process, or a spin-on process of a polymer as previously described or using a bonded foil such as an adhesive sticker.

This method can be used in connection with fabrication processes 1, 2 and 3. In process 1 the steps illustrated by FIGS. 1*b*-1*h* are made unnecessary. In process 2 the steps illustrated by FIGS. 2*b*-2*j* are made unnecessary.

Figure 16:
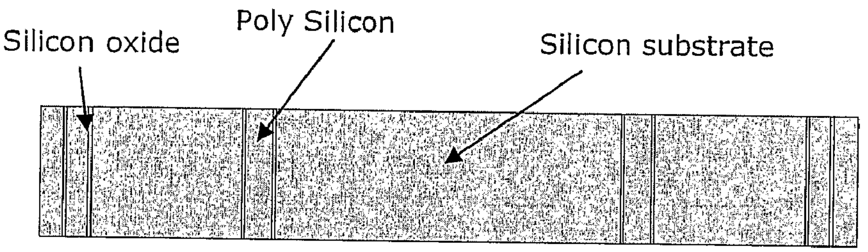
FIGS. 16-18 are cross-sectional side views of a semiconductor structure during various fabrication steps illustrating the use of an insulating oxide for vertical confinement during anodization.
Figure 17:
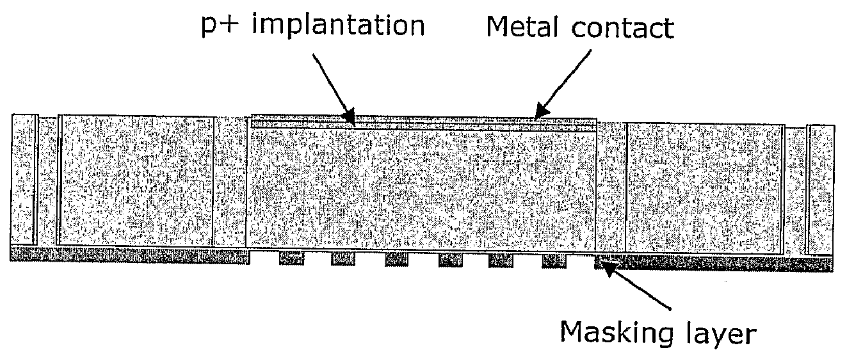
Figure 18:
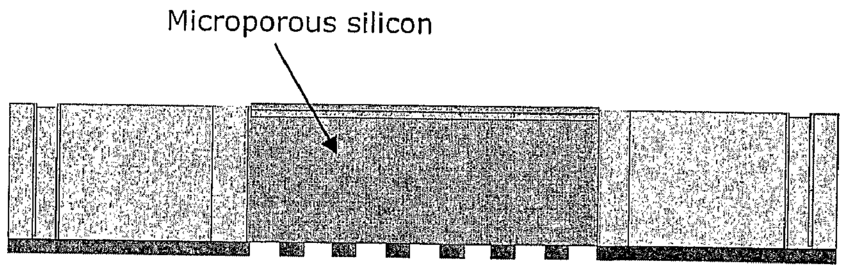

Confinement of Anodized Volume Using Via Process, FIGS. 16-18

To control the lateral extension of the anodized volume more precisely, it is possible to use an existing via process to confine the anodized volume. Thus, the formed insulating vertical silicon oxide may serve as a lateral confinement for the anodization. This process may be used in process 2 where it will be formed during the steps illustrated by FIG. 2*c*-2*e* and in fabrication process 3 used for the die illustrated in FIG. 3.

The process is illustrated in FIGS. 16-18, as described in the following:

FIG. 16: A standard wafer has been processed with vias as previously described using a standard via process. This wafer may also have CMOS circuitry on it. The via process has been used for making a trench of circular or other shape as seen from top of the wafer.

FIG. 17: A p+ implant is made and a metal contact is deposited on top of the wafer inside the periphery of the trench formed from the via process. These p+ implant and metal contact can be part of the CMOS processing if CMOS circuitry is included on the wafer. On the backside of the wafer a masking layer is deposited and patterned. This masking layer can be a $SiO_2$ layer or a SU8 photoresist layer.

FIG. 18: The silicon is anodized using an electrochemical etching cell. Due to the insulating vias the porous silicon is confined to within the trench.

It is also possible from FIG. 17 to proceed with an isotropic reactive ion etch instead of the porous silicon formation. This will be confined by the $SiO_2$ layer on the sides of the trench. This requires that the membrane and backplate are formed prior to the formation of the back chamber. This process can be used specifically in process 2 from the step illustrated by FIG. 2*p*. Furthermore the steps illustrated by FIGS. 2*g*-2*j* are made unnecessary.

Further Embodiments of the Invention Including CMOS Circuitry

Figure 3:
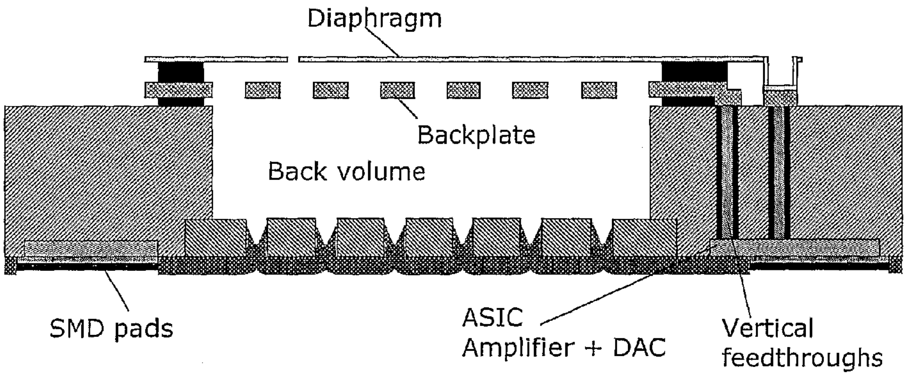
FIG. 3 is a cross-sectional side view of an acoustic single die MEMS transducer according to a second embodiment of the present invention having CMOS circuitry formed on the die.

A second embodiment of an acoustic single die MEMS transducer having CMOS circuitry formed on the die is illustrated in FIG. 3.

The main difference between the single die solutions of FIG. 2*v* and FIG. 3 is that in FIG. 2*v* the CMOS circuitry is formed on the front surface part of the die, while for the solution of FIG. 3 the CMOS circuitry is formed on the back surface part of the die. The process steps used to produce the single die MEMS transducer of FIG. 3 are similar to the process steps of FIGS. 2*a*-2*v*, but the CMOS integration is performed on the backside of the wafer in stead of on the front side of the wafer as illustrated in FIG. 2*f*. Here the CMOS has to be processed into regions of the backside of the die that did not receive the high doping so that a CMOS compatible die surface is maintained. For that purpose the doping has to be performed selectively for example by ion implantation through an oxide or photoresist mask.

It is also noted that for single die MEMS transducer illustrated in FIG. 3, there is no backside Si-oxide layer between the backside of the silicon substrate and the sealing capping layer. This backside Si-oxide layer is provided during the formation of the first insulation Si-oxide layer illustrated in FIG. 2*j* and may be removed during the sacrificial oxide etching of the oxide layers below and above the back plate as illustrated in FIG. 2*t*.

For the embodiments of FIGS. 2*v* and 3, the arrangement of the SMD pads on the backside of the die make these single die MEMS transducers very well suited for surface mounting, SMD, techniques.

Figure 4:
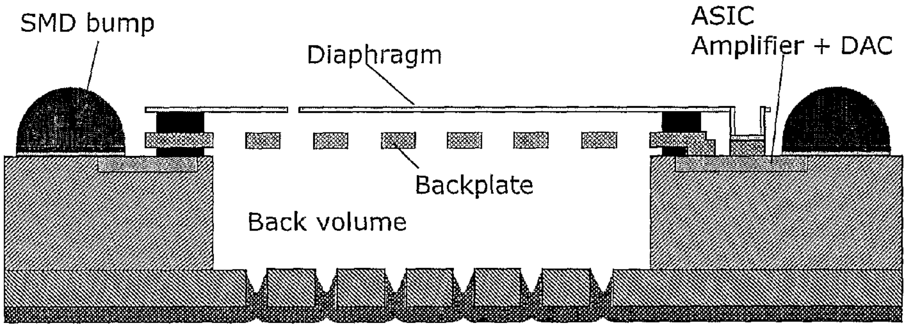
FIG. 4 is a cross-sectional side view of an acoustic single die MEMS transducer according to a third embodiment of the present invention having CMOS circuitry formed on the die.

A third embodiment of an acoustic single die MEMS transducer having CMOS circuitry formed on the die is illustrated in FIG. 4.

The main difference between the single die solutions of FIG. 2*v* and FIG. 4 is that in FIG. 4 there are no contact pads on the backside of the die, and hence there are no feedthroughs for obtaining electrical contact from the front to the backside of the die. Thus the steps illustrated in FIGS. 2*c*-2*e* are omitted for the solution of FIG. 4, and the backside contact steps illustrated in FIGS. 2*n*-2*p* are replaced by corresponding steps for providing front side contacts, to thereby obtain electrical contact to the CMOS circuitry on the front side. Also for the single die MEMS transducer illustrated in FIG. 4, there is no backside Si-oxide layer between the backside of the silicon substrate and the sealing capping layer, see the above discussion given in connection with FIG. 3.

For the embodiment of FIG. 4, the front side contacts have SMD bump pads, which are reaching higher than the diaphragm, whereby the single die MEMS transducer of FIG. 4 is also well suited for surface mounting, SMD, techniques.

For the embodiments of the present invention discussed above in connection with FIGS. 1-4, the diaphragm of the microphone is arranged above the back plate. However, it should be understood that single die microphones using the herein described principles but having the back plate formed or arranged above the diaphragm are also part of the present invention. When referring to the MEMS microphone structure processing steps illustrated in FIGS. 2*j*-2*m*, wherein the diaphragm is arranged above the back plate, then when having the back plate arranged above the diaphragm, the process steps of FIGS. 2*k* and 2*m* should be switched. That is, the first low temperature Si-oxide insulation layer is formed on the front side and the backside of the substrate, see FIG. 2*j*, then a low temperature conductive Si based material, e.g. SiGe or sandwich layer with silicon nitride, is deposited and structured to obtain the diaphragm, see FIG. 2*m*. When the diaphragm is formed, then a second low temperature Si-oxide insulation layer is formed on top of the back plate and the first Si-oxide layer, see FIG. 21. Finally a low temperature conductive Si based material, e.g. SiGe or sandwich layer with silicon nitride, is deposited and structured on top of the second Si-oxide layer to form the back plate, see FIG. 2*k*. From FIG. 2*m* it is seen that a ventilation hole may be formed in the diaphragm in order to obtain a static pressure equalizing vent or opening. The etching of the second SI-oxide layer may be performed from the front side of the die through the openings of the back plate.

It should be understood that various modifications may be made to the above-described embodiments and it is desired to include all such modifications and functional equivalents as fall within the scope of the accompanying claims.

The invention claimed is:

1. An acoustic micro-electrical-mechanical-system (MEMS) transducer formed on a single die based on a semiconductor material and having front and back surface parts opposed to each other, said acoustic MEMS transducer comprising:

a cavity formed in the die to thereby provide a back volume with an upper portion facing an opening of the cavity and a lower portion facing a bottom of the cavity, and a back plate and a diaphragm arranged substantially in parallel, with an air gap there between and extending at least partly across the opening of the cavity, said back plate and diaphragm being integrally formed with the front surface part of the die, wherein the bottom of the cavity is bounded by the die;

wherein backside openings are formed in the die with said openings extending from the back surface part of the die to the cavity bottom.

2. An acoustic transducer according to claim 1, wherein the diaphragm is arranged above the back plate and at least partly extending across the back plate.

3. An acoustic transducer according to claim 1, wherein at least part of or all of the backside openings are acoustically sealed by a sealing material.

4. An acoustic transducer according to claim 1, wherein the distance from the bottom to the top or opening of the cavity is in the range of 100-500 μm.

5. An acoustic transducer according to claim 1, wherein an integrated circuit is formed in the front surface part of the die, said diaphragm and back plate being electrically connected to the integrated circuit via electrical connections formed in or on the front surface part of the die.

6. An acoustic transducer according to claim 5, wherein one or more contact pads are formed in or on the front surface part of the die, said contact pad(s) being electrically connected to the integrated circuit via one or more electrical connections formed in or on the front surface part of the die.

7. An acoustic transducer according to claim 6, wherein at least part of the contact pads are compatible with surface mount device (SMD) process techniques and are formed on a substantially plane part of the front surface part of the die.

8. An acoustic micro-electrical-mechanical-system (MEMS) transducer formed on a single die based on a semiconductor material and having front and back surface parts opposed to each other, said acoustic MEMS transducer comprising:

a cavity formed in the die to thereby provide a back volume with an upper portion facing an opening of the cavity and a lower portion facing a bottom of the cavity, and a back plate and a diaphragm arranged substantially in parallel, with an air gap there between and extending at least partly across the opening of the cavity, said back plate and diaphragm being integrally formed with the front surface part of the die, wherein the bottom of the cavity is bounded by the die;

wherein an integrated circuit is formed in the front surface part of the die, said diaphragm and back plate being electrically connected to the integrated circuit via electrical connections formed in or on the front surface part of the die;

wherein one or more contact pads are formed in or on the back surface part of the die, said contact pad(s) being electrically connected to the integrated circuit via one or more electrical feedthroughs from the front surface part of the die to the back surface part of the die.

9. An acoustic transducer according to claim 8, wherein the back surface part of the die is substantially plane and at least part of the contact pads are compatible with SMD process techniques.

10. An acoustic transducer according to claim 8, wherein the die comprises a Si-based material.

11. An acoustic transducer according to claim 8, wherein the back plate and/or the diaphragm is/are formed by an electrically conductive Si-based material.

12. An acoustic micro-electrical-mechanical-system (MEMS) transducer formed on a single die based on a semiconductor material and having front and back surface parts opposed to each other, said acoustic MEMS transducer comprising:

a cavity formed in the die to thereby provide a back volume with an upper portion facing an opening of the cavity and a lower portion facing a bottom of the cavity, and a back plate and a diaphragm arranged substantially in parallel, with an air gap there between and extending at least partly across the opening of the cavity, said back plate and diaphragm being integrally formed with the front surface part of the die, wherein the bottom of the cavity is bounded by the die;

wherein an integrated circuit is formed in the back surface part of the die, said diaphragm and back plate being electrically connected to the integrated circuit via electrical feedthroughs from the front surface part of the die to the back surface part of the die.

13. An acoustic transducer according to claim 12, wherein one or more contact pads are formed in or on the back surface part of the die, said contact pad(s) being electrically connected to the integrated circuit via one or more electrical connections formed in or on the back surface part of the die.

14. An acoustic transducer according to claim 12, wherein the die comprises a Si-based material.

15. An acoustic transducer according to claim 12, wherein the back plate and/or the diaphragm is/are formed by an electrically conductive Si-based material.

* * * * *

UNITED STATES PATENT AND TRADEMARK OFFICE

CERTIFICATE OF CORRECTION

PATENT NO. : 8,188,557 B2
APPLICATION NO. : 12/295220
DATED : May 29, 2012
INVENTOR(S) : Pirmin Rombach, Morten Berg Arnoldus and Morten Ginnerup It is certified that error appears in the above-identified patent and that said Letters Patent is hereby corrected as shown below:

Title page, Item 87, should read

-- PCT Pub. No: WO2007/112743 --

Signed and Sealed this
Seventeenth Day of July, 2012

David J. Kappos
*Director of the United States Patent and Trademark Office*